US012593549B2

(12) United States Patent
Shin et al.

(10) Patent No.: US 12,593,549 B2
(45) Date of Patent: Mar. 31, 2026

(54) DISPLAY DEVICE

(71) Applicant: Samsung Display Co., LTD., Yongin-si (KR)

(72) Inventors: Dong Hee Shin, Yongin-si (KR); Sun Kwun Son, Yongin-si (KR); Chong Chul Chai, Yongin-si (KR); Na Hyeon Cha, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 737 days.

(21) Appl. No.: 17/969,088

(22) Filed: Oct. 19, 2022

(65) Prior Publication Data

US 2023/0207759 A1     Jun. 29, 2023

(30) Foreign Application Priority Data

Dec. 29, 2021     (KR) ........................ 10-2021-0191615

(51) Int. Cl.
H01L 33/62 (2010.01)
G09G 3/32 (2016.01)
H10H 20/857 (2025.01)

(52) U.S. Cl.
CPC ............. H10H 20/857 (2025.01); G09G 3/32 (2013.01); *G09G 2310/0278* (2013.01)

(58) Field of Classification Search
CPC ................... H10H 20/857; G09G 3/32; G09G 2310/0278; G09G 2300/0426; G09G 2300/0804; G09G 2300/0861; G09G 2320/0295; G09G 3/3233; H10K 59/131; H10D 86/441
See application file for complete search history.

(56) References Cited

U.S. PATENT DOCUMENTS

| | | |
|---|---|---|
| 10,692,439 B2 | 6/2020 | Kim et al. |
| 11,514,859 B2 | 11/2022 | Jang et al. |
| 2019/0051249 A1 | 2/2019 | Nie et al. |
| 2020/0394967 A1 | 12/2020 | Park et al. |
| 2021/0064162 A1 | 3/2021 | Yin et al. |
| 2021/0247635 A1 | 8/2021 | Shin et al. |
| 2021/0375176 A1 | 12/2021 | Shin et al. |
| 2022/0077273 A1 | 3/2022 | Qing et al. |

FOREIGN PATENT DOCUMENTS

| | | |
|---|---|---|
| KR | 10-1957738 | 3/2019 |
| KR | 10-2019-0046420 | 5/2019 |
| KR | 10-2021-0086314 | 7/2021 |
| KR | 10-2021-0100795 | 8/2021 |
| WO | 2021/098508 | 5/2021 |

*Primary Examiner* — Elmito Breval

(74) *Attorney, Agent, or Firm* — Womble Bond Dickinson (US) LLP

(57) ABSTRACT

A display device may include a pixel part including a pixel, a pad part including a first pad part and a second pad part, and a connection line including a first connection line extending in a first direction and a second connection line extending in a second direction. The display area may include a first display area overlapping the first pad part in the first direction and a second display area overlapping the second pad part in the first direction.

21 Claims, 18 Drawing Sheets

ELL1

SCL1

ACT

SCL2

INF

ELL2

SPX

PXC

DL       VDD

Cst       M5       Ei

M2

N1       M1

M3

SLi

SLi-1       M4

M6

M7

SLi+1

Vint

ELT1

LD       EMU

ELT2

VSS

SPX

CP

SL2_2

SL2

SPX

SL2_3

SPX

DR1

DR2

DR3

DISPLAY DEVICE

CROSS REFERENCE TO RELATED APPLICATION(S)

This application claims priority to and benefits of Korean Patent Application No. 10-2021-0191615 under 35 U.S.C. § 119, filed in the Korean Intellectual Property Office (KIPO) on Dec. 29, 2021, the entire contents of which are incorporated herein by reference.

BACKGROUND

1. Technical Field

The disclosure relates to a display device.

2. Description of the Related Art

In recent years, as interest in information display is increasing, research and development for a display device are continuously being conducted.

SUMMARY

An object of the disclosure is to provide a display device in which a process performance may be improved and a display surface of a large area may be secured Objects of the disclosure are not limited to the above-described object, and other technical objects which are not described will be clearly understood by those skilled in the art from the following description.

According to an embodiment of the disclosure, a display device including a display area and a pad area may be provided. The display device may include a pixel part disposed in the display area and including a pixel, a pad part disposed in the pad area and including at least one first pad part and at least one second pad part, and a connection line including a first connection line extending in a first direction and a second connection line extending in a second direction different from the first direction. The display area may include a first display area overlapping the at least one first pad part in the first direction, and a second display area at least partially overlapping the at least one second pad part in the first direction, the first connection line may include a first extension data connection line overlapping the at least one second pad part in the first direction, the second connection line may include a second extension data connection line electrically connected to the first extension data connection line, and the at least one second pad part may be electrically connected to the pixel in the second display area through the first extension data connection line and the second extension data connection line.

The display device may further include a scan driver that provides a scan signal for the pixel, and a data driver that provides a data signal for the pixel. The scan driver and the data driver may be disposed on a same side of the pixel part.

The display area may include a short side and a long side, and the scan driver and the data driver may be disposed closer to the long side than the short side.

The first connection line may include a first scan line electrically connected to the at least one first pad part without being connected to the at least one second pad part, the second connection line may include a second scan line electrically connected to the first scan line, and the pixel may be electrically connected to the at least one first pad part through the first scan line and the second scan line.

The first scan line may be disposed in the first display area without being disposed in the second display area, and the second scan line may be disposed in the first display area or disposed over the first display area and the second display area.

The first connection line may include a (1_1)-th connection line electrically connected to the at least one first pad part and a (1_2)-th connection line electrically connected to the at least one second pad part, the second connection line may include a (2_1)-th connection line electrically connected to the (1_1)-th connection line and a (2_2)-th connection line electrically connected to the (1_2)-th connection line, the (1_2)-th connection line may include the first extension data connection line, and the (2_2)-th connection line may include the second extension data connection line.

The display device may further include a fan-out area, which is an area in which a distance between the (2_1)-th connection lines adjacent to each other in the second direction is changed. The fan-out area may be disposed in the first display area without being disposed in the second display area.

The (1_1)-th connection line and the (2_1)-th connection line may be electrically connected to each other in a first contact part disposed in the first display area, the (1_2)-th connection line and the (2_2)-th connection line may be electrically connected to each other in a second contact part disposed in the second display area, and an outer line of the fan-out area may correspond to a line on which the first contact part is arranged.

The fan-out area may overlap the at least one first pad part along the first direction and does not overlap the at least one second pad part in the first direction.

The pixel may include a first pixel disposed in the first display area and a second pixel disposed in the second display area, the first connection line may include a first scan line, the second connection line may include a second scan line, the first pixel and the second pixel may receive a scan signal through any one of the first scan line and the second scan line connected to any one of the at least one first pad part, the first pixel may receive a data signal provided through another one of the at least one first pad part, and the second pixel may receive a data signal provided through one of the at least one second pad part.

The second display area may include a (2_1)-th display area and a (2_2)-th display area each adjacent to the first display area in the first direction, and the (2_1)-th display area may be disposed on a side of the first display area, and the (2_2)-th display area may be disposed on another side of the first display area.

The display device may further include line parts each including a portion of the first connection lines and provided in a pattern repeatedly arranged multiple times. The line parts may include a first line part disposed in the first display area, a second line part disposed in the second display area, and a third line part each disposed in the second display area, the first line part may include the first scan line, the second line part and the third line part may not include the first scan line, the second line part may include the first extension data connection line, and the third line part may not include the first extension data connection line.

The pixel disposed in the second display area may receive a scan signal through the first scan line included in the first line part.

Each of the first line part, the second line part, and the third line part may include data lines, and the first extension data connection line of the second line part may be electrically connected to the data lines of the third line part through the second extension data connection line disposed in the second display area.

At least part of connection lines of the second line part may transmit a data signal provided to the third line part.

The first extension data connection line of second line part may include a (1_1)-th data connection line, a (2_1)-th data connection line, and a (3_1)-th data connection line, the second extension data connection line may include a (1_2)-th data connection line, a (2_2)-th data connection line, and a (3_2)-th data connection line, the third line part may include a first data line, a second data line, and a third data line, the (1_2)-th data connection line may electrically connect the (1_1)-th data connection line and the first data line of the third line part, the (2_2)-th data connection line may electrically connect the (2_1)-th data connection line and the second data line of the third line part, and the (3_2)-th data connection line may electrically connect the (3_1)-th data connection line and the third data line of the third line part.

The first scan line of first line part may include a (1_1)-th scan line, a (1_2)-th scan line, and a (1_3)-th scan line, and the (1_1)-th scan line, the (1_2)-th scan line, and the (1_3)-th scan line may correspond to the (1_1)-th data connection line, the (1_2)-th data connection line, and the (1_3)-th data connection line of the second line part in a repeated pattern.

The third line part may further include a residual line, and the residual line may correspond to the (1_1)-th data connection line, the (1_2)-th data connection line, and the (1_3)-th data connection line of the second line part in a repeated pattern.

The (1_2)-th data connection line may be electrically connected to the first data line of the third line part at a first contact position, the (2_2)-th data connection line may be electrically connected to the second data line of the third line part at a second contact position, the (3_2)-th data connection line may be electrically connected to the third data line of the third line part at a third contact position, and a direction in which the first contact position, the second contact position, and the third contact position are arranged may be different from the first direction and the second direction.

The second scan line may include a (2_1)-th scan line disposed at a side of a first pixel row, a (2_2)-th scan line disposed at a side of a second pixel row, and a (2_3)-th scan line disposed at a side of a third pixel row, the first pixel row, the second pixel row, and the third pixel row may be pixel rows adjacent to each other, the (1_1)-th scan line may be electrically connected to one of the pixels disposed in the first pixel row through the (2_1)-th scan line, the (1_2)-th scan line may be electrically connected to one of the pixels disposed in the second pixel row through the (2_2)-th scan line, and the (1_3)-th scan line may be electrically connected to one of the pixels disposed in the third pixel row through the (2_3)-th scan line.

According to an embodiment of the disclosure, a display device including a display area and a pad area may be provided. The display device may include a pixel provided in the display area, a scan driver providing a scan signal for the pixel, a data driver providing a data signal for the pixel, a line bundle extending in a first direction and having line patterns repeatedly disposed, and a pad part disposed in the pad area and including a scan pad part electrically connected to the scan driver and a data pad part electrically connected to the data driver. The line bundle may include a first line bundle, a second line bundle, and a third line bundle each including a data line, the first line bundle may include a first scan line extending in the first direction, the second line bundle may include an extension data connection line corresponding to the first scan line of the first line bundle in a repeated pattern, the second line bundle and the third line bundle may not include the first scan line, the third line bundle may not overlap the data pad part in the first direction, and the data line of the third line bundle may be electrically connected to the data pad part through the extension data connection line of the second line bundle.

A solution means of the object of the disclosure is not limited to the above-described solution means, and solution means which are not described will be clearly understood by those skilled in the art from the present specification and the accompanying drawings.

According to an embodiment of the disclosure, a process performance may be improved and a display surface of a large area may be secured An effect of the disclosure is not limited to the above-described effects, and effects which are not described will be clearly understood by those skilled in the art from the present specification and the accompanying drawings.

BRIEF DESCRIPTION OF THE DRAWINGS

The above and other features of the disclosure will become more apparent by describing in further detail embodiments thereof with reference to the accompanying drawings, in which:

FIGS. 1 and 2 are schematic perspective and cross-sectional views illustrating a light emitting element according to an embodiment;

FIGS. 3 and 4 are schematic perspective and cross-sectional views illustrating a light emitting element according to another embodiment;

FIGS. 5 and 6 are schematic perspective and cross-sectional views illustrating a light emitting element according to still another embodiment;

FIG. 7 is a schematic block diagram illustrating a display device according to an embodiment;

FIG. 9 is a schematic diagram of an equivalent circuit of a pixel circuit included in a sub-pixel according to another embodiment;

FIGS. 12 to 14 are schematic plan views illustrating a display device according to an embodiment, and are schematic plan views illustrating a pad area and a display area;

FIG. 15 is a schematic plan view of a display device illustrating a connection structure of scan lines according to an embodiment.

DETAILED DESCRIPTION OF THE EMBODIMENT

Figure 2:
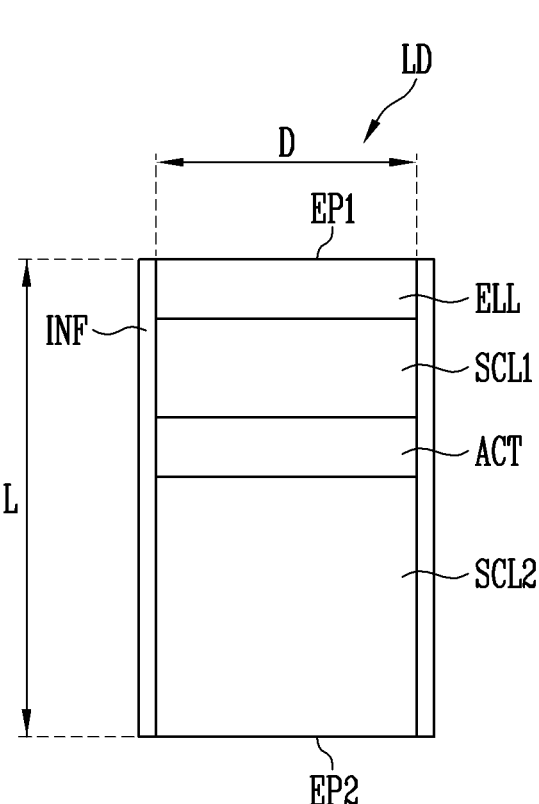

Since the embodiment described in the specification is for clearly describing features of the disclosure to those skilled in the art to which the disclosure pertains, the disclosure is not limited by the embodiment described in the specification, and the scope of the disclosure should be interpreted as including modifications or variations that do not depart from features of the disclosure.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

The drawings attached to the specification are intended to readily describe the disclosure. Since the shape shown in the drawings may be exaggerated and displayed as necessary to help understanding of the disclosure, the disclosure is not limited by the drawings.

It will be understood that the terms "contact," "connected to," and "coupled to" may include a physical and/or electrical contact, connection, or coupling.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The term "and/or" includes all combinations of one or more of which associated configurations may define. For example, "A and/or B" may be understood to mean "A, B, or A and B."

The phrase "at least one of" is intended to include the meaning of "at least one selected from the group of" for the purpose of its meaning and interpretation. For example, "at least one of A and B" may be understood to mean "A, B, or A and B."

The disclosure relates to a display device. Hereinafter, a display device according to an embodiment is described with reference to the accompanying drawings.

Figure 1:
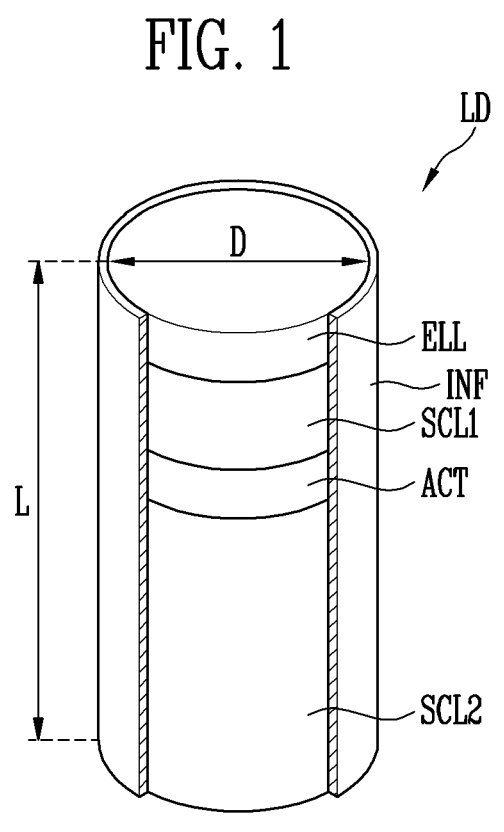
Figure 3:
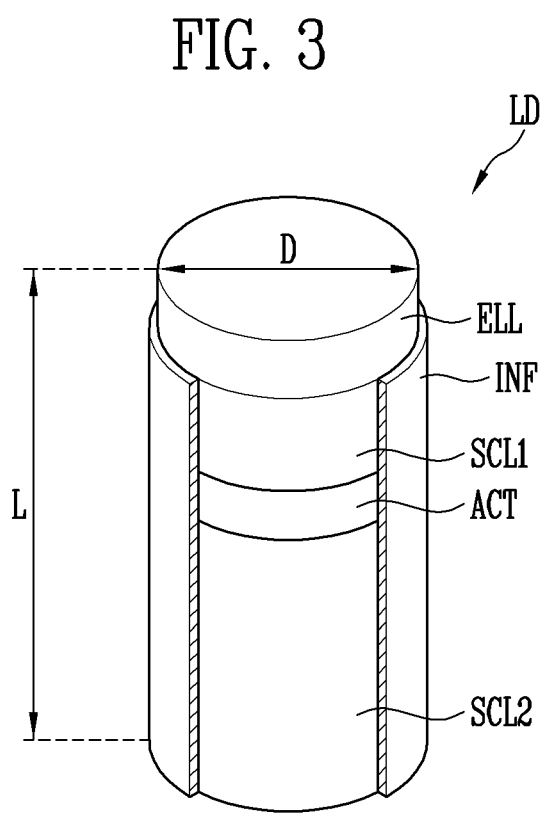
Figure 4:
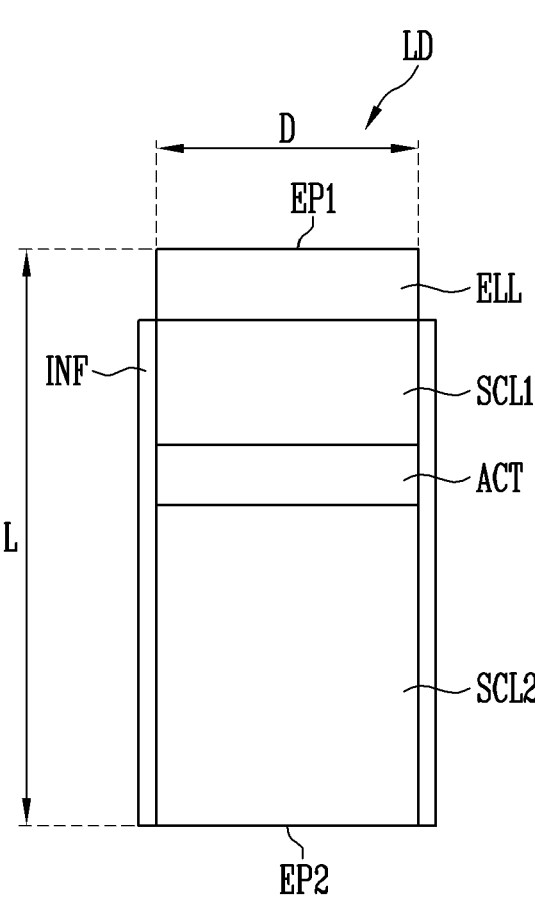
Figure 5:
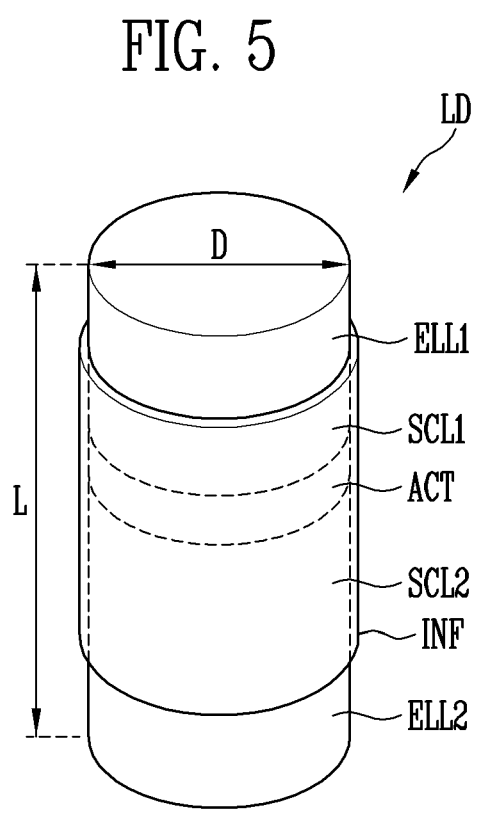
Figure 6:
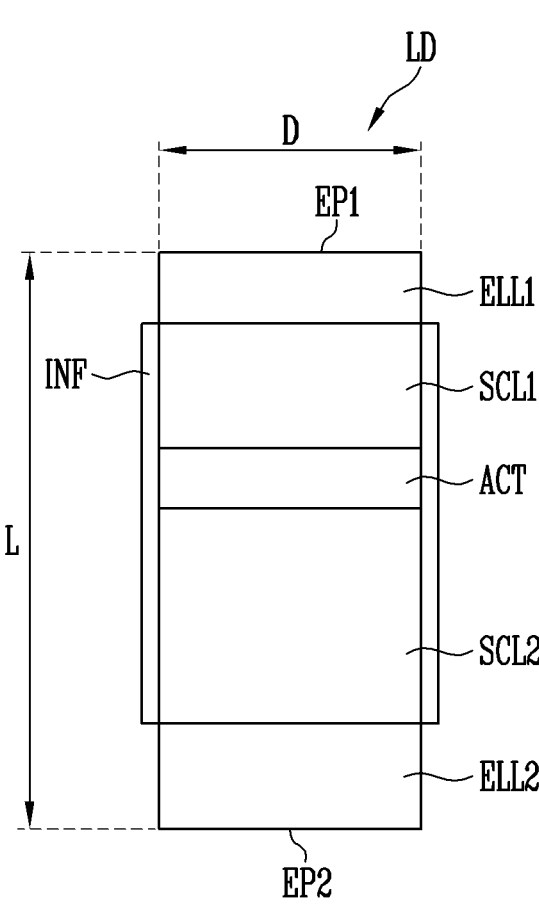

FIGS. 1 and 2 are schematic perspective and cross-sectional views illustrating a light emitting element according to an embodiment. FIGS. 3 and 4 are schematic perspective and cross-sectional views illustrating a light emitting element according to another embodiment. FIGS. 5 and 6 are schematic perspective and cross-sectional views illustrating a light emitting element according to still another embodiment.

Although a light emitting element LD having a column shape (or columnar light emitting element) is shown in FIGS. 1 to 6, a type and/or a shape of the light emitting element LD are/is not limited thereto.

First, the light emitting element LD according to an embodiment is described with reference to FIGS. 1 and 2.

Referring to FIGS. 1 and 2, the light emitting element LD may include a second semiconductor layer SCL2, a first semiconductor layer SCL1, and an active layer ACT interposed between the first and second semiconductor layers SCL1 and SCL2. For example, in case that an extension direction of the light emitting element LD is referred to as a length L direction, the light emitting element LD may include the first semiconductor layer SCL1, the active layer ACT, and the second semiconductor layer SCL2 sequentially stacked each other in the length L direction. The light emitting element LD may further include an electrode layer ELL and an insulating layer INF.

The light emitting element LD may be provided in a column shape extending in a direction. The light emitting element LD may have a first end EP1 and a second end EP2. The first semiconductor layer SCL1 may be adjacent to the first end EP1 of the light emitting element LD, and the second semiconductor layer SCL2 may be adjacent to the second end EP2 of the light emitting element LD.

The light emitting element LD may be a light emitting element manufactured in a column shape by an etching method or the like. In the specification, the column shape may include a rod-like shape or a bar-like shape that is long in the length L direction (for example, an aspect ratio is greater than 1) such as a circular column or a polygonal column, and a shape of a cross-section thereof is not particularly limited. For example, a length L of the light emitting element LD may be greater than a diameter D (or a width of a cross-section) thereof.

The light emitting element LD may have a size of a nano scale to a micro scale. For example, each of the light emitting elements LD may have a diameter D (or a width) and/or a length L of a range of a nano scale to a micro scale. However, the size of the light emitting element LD is not limited thereto.

The first semiconductor layer SCL1 may be a semiconductor layer of a first conductivity type. The first semiconductor layer SCL1 may be disposed on the active layer ACT and may include a semiconductor layer of a type different from that of the second semiconductor layer SCL2. For example, the first semiconductor layer SCL1 may include a P-type semiconductor layer. For example, the first semiconductor layer SCL1 may include at least one semiconductor material of InAlGaN, GaN, AlGaN, InGaN, AlN, and InN, and may include a P-type semiconductor layer doped with a first conductivity type dopant such as Mg. However, a material forming the first semiconductor layer SCL1 is not limited thereto, and various other materials may form the first semiconductor layer SCL1.

The active layer ACT may be disposed on the second semiconductor layer SCL2 and may be formed in a single-quantum well or multi-quantum well structure. A position of the active layer ACT may be variously changed according to a type of the light emitting element LD.

A clad layer doped with a conductive dopant may be formed on and/or under the active layer ACT. For example, the cladding layer may be formed of an AlGaN layer or an InAlGaN layer. According to an embodiment, a material of AlGaN, InAlGaN, or the like may be used to form the active layer ACT, and various other materials may form the active layer ACT.

The second semiconductor layer SCL2 may be a semiconductor layer of a second conductivity type. The second semiconductor layer SCL2 may be disposed on the active layer ACT and may include a semiconductor layer of the type different from that of the first semiconductor layer SCL1. For example, the second semiconductor layer SCL2 may include an N-type semiconductor layer. For example, the second semiconductor layer SCL2 may include a semiconductor material of any one of InAlGaN, GaN, AlGaN, InGaN, AlN, and InN, and may include an N-type semiconductor layer doped with a second conductivity type dopant such as Si, Ge, or Sn. However, a material forming the second semiconductor layer SCL2 is not limited thereto, and various other materials may form the second semiconductor layer SCL2.

In case that a voltage greater than or equal to a threshold voltage is applied to ends (e.g., both ends) of the light emitting element LD, the light emitting element LD emits light while electron-hole pairs are combined in the active layer ACT. By controlling the light emission of the light emitting element LD with this principle, the light emitting element LD may be used as a light source of various light emitting devices including a pixel of a display device.

The insulating layer INF may be disposed on a surface of the light emitting element LD. The insulating layer INF may be formed on the surface of the light emitting element LD to surround at least an outer circumferential surface of the active layer ACT, and may further surround an area of the electrode layer ELL and the first and second semiconductor layers SCL1 and SCL2. The insulating layer INF may be formed of a single layer or double layers, but is not limited thereto, and may be formed of layers. For example, the insulating layer INF may include a first insulating layer including a first material and a second insulating layer including a second material different from the first material.

The insulating layer INF may expose the ends of the light emitting element LD having different polarities. For example, the insulating layer INF may expose an end of each of the electrode layer ELL and the second semiconductor layer SCL2 adjacent to the first and second ends EP1 and EP2 of the light emitting element LD.

The insulating layer INF may be formed of a single layer or multiple layers including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$), but is not limited thereto. For example, according to an embodiment, the insulating layer INF may be omitted.

According to an embodiment, in case that the insulating layer INF is provided to cover the surface of the light emitting element LD, particularly, the outer circumferential surface of the active layer ACT, electrical stability of the light emitting element LD may be secured. In addition, in case that the insulating layer INF is provided on the surface of the light emitting element LD, a surface defect of the light emitting element LD may be minimized to improve lifespan and efficiency. In addition, even in case that light emitting elements LD are disposed close to each other, an unwanted short circuit may be prevented from occurring between the light emitting elements LD.

The electrode layer ELL may be disposed on the first semiconductor layer SCL1. The electrode layer ELL may be adjacent to the first end EP1. The electrode layer ELL may be electrically connected to the first semiconductor layer SCL1. According to an embodiment, a portion of the electrode layer ELL may be exposed. For example, the insulating layer INF may expose a surface of the electrode layer ELL.

The electrode layer ELL may be an ohmic contact electrode. However, the disclosure is not limited to the above-described example. For example, the electrode layer ELL may be a Schottky contact electrode.

According to an embodiment, the electrode layer ELL may include one of chromium (Cr), titanium (Ti), aluminum (Al), gold (Au), nickel (Ni), indium tin oxide (ITO), an oxide or alloy thereof. However, the disclosure is not limited to the above-described example. According to an embodiment, the electrode layer ELL may be substantially transparent. Accordingly, emitted light may pass through the electrode layer ELL.

A light emitting element LD according to an embodiment is described with reference to FIGS. 3 and 4. Compared with the light emitting element LD according to the above-described embodiment, a different point is mainly described.

Referring to FIGS. 3 and 4, a side surface of the electrode layer ELL may be exposed. The insulating layer INF may expose the side surface of the electrode layer ELL. For example, the insulating layer INF may cover side surfaces of each of the first semiconductor layer SCL1, the active layer ACT, and the second semiconductor layer SCL2, and may not cover at least a portion of the side surface of the electrode layer ELL. Electrical connection to another configuration of the electrode layer ELL adjacent to the first end EP1 may be readily achieved. According to an embodiment, the insulating layer INF may expose a portion of the side surface of the first semiconductor layer SCL1 and/or the second semiconductor layer SCL2 as well as the side surface of the electrode layer ELL.

The light emitting element LD according to still another embodiment is described with reference to FIGS. 5 and 6. Compared with the light emitting element LD according to the above-described embodiment, a different point is mainly described.

Referring to FIGS. 5 and 6, the light emitting element LD may include a first electrode layer ELL1 and a second electrode layer ELL2. The first electrode layer ELL1 may be disposed on the first semiconductor layer SCL1. The second electrode layer ELL2 may be disposed on the second semiconductor layer SCL2. The first electrode layer ELL1 may be adjacent to the first end EP1. The second electrode layer ELL2 may be adjacent to the second end EP2.

According to an embodiment, the first electrode layer ELL1 and the second electrode layer ELL2 may be an ohmic contact electrode or a Schottky contact electrode.

According to an embodiment, side surfaces of the first electrode layer ELL1 and the second electrode layer ELL2 may be exposed. The insulating layer INF may expose the side surfaces of each of the first electrode layer ELL1 and the second electrode layer ELL2. For example, the insulating layer INF may not cover a portion of the side surfaces of each of the first electrode layer ELL1 and the second electrode layer ELL2. According to an embodiment, the insulating layer INF may expose a portion of the side surface of the first semiconductor layer SCL1 and/or the second semiconductor layer SCL2 as well as the side surfaces of the first electrode layer ELL1 and the second electrode layer ELL2.

A structure, a shape, and the like of the light emitting element LD are not limited to the above-described example, and the light emitting element LD may have various structures and shapes according to an embodiment.

Figure 7:
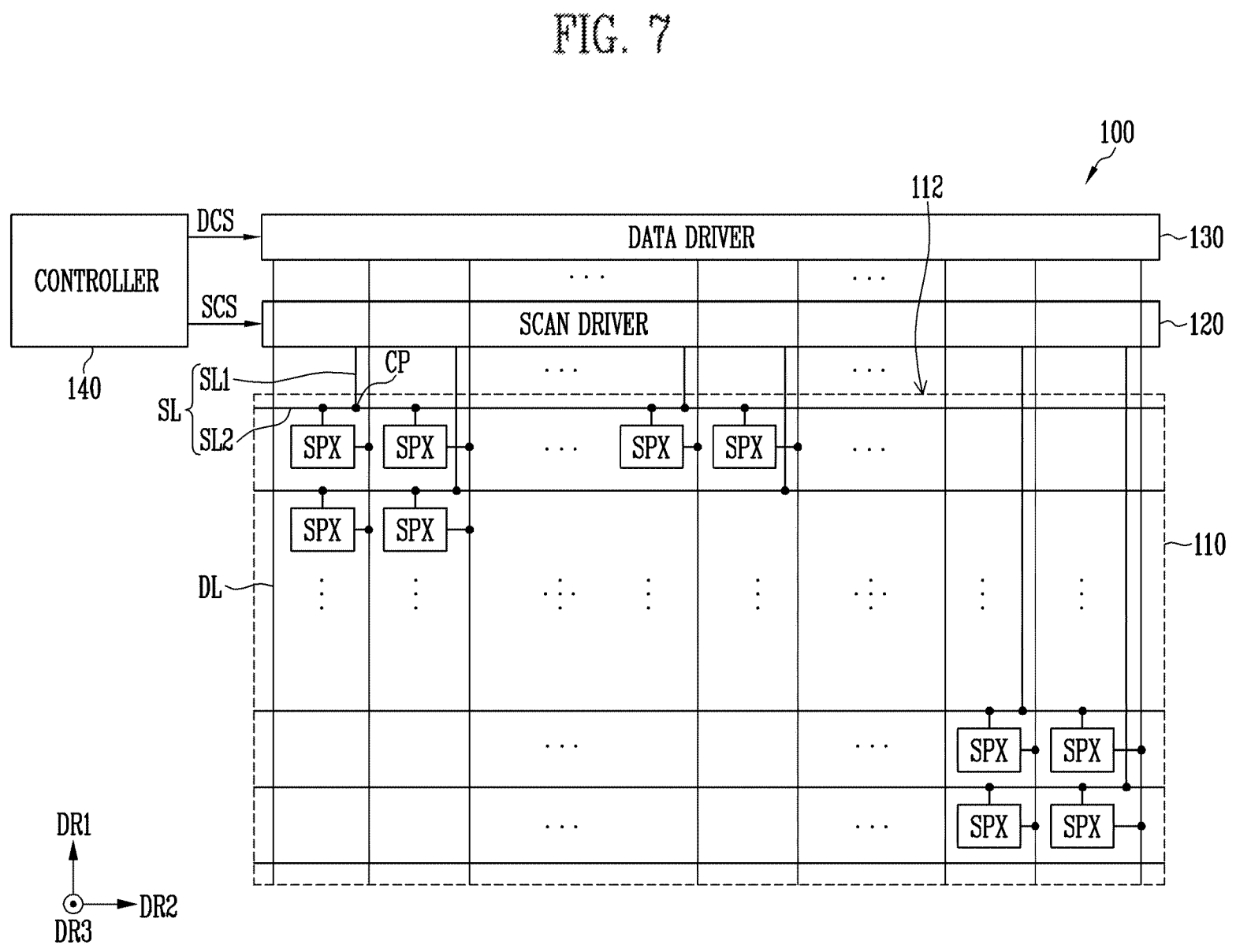

FIG. 7 is a schematic block diagram illustrating a display device according to an embodiment.

A display device 100 is configured to emit light. The display device 100 may be an electronic device using the light emitting element LD described above with reference to FIGS. 1 to 6 as a light source. According to an embodiment, the display device 100 may be one of a tablet PC, a television, a smartphone, and a laptop computer, but is not limited to a specific example. For example, the display device 100 may be applied to an infotainment system for a vehicle, smart glasses, a smartwatch, or the like.

The display device 100 may include a pixel part 110, a scan driver 120, a data driver 130, and a controller 140.

The pixel part 110 may include sub-pixels SPX connected to a scan line SL and a data line DL. According to an embodiment, at least one of the sub-pixels SPX may form (or configure) a pixel PX (see FIG. 16) (or a pixel part). For example, the sub-pixels SPX may form the pixel part, and may include a first sub-pixel SPX1 (see FIG. 16) emitting light of a first color (for example, red), a second sub-pixel SPX2 (see FIG. 16) emitting light of a second color (for example, green), and a third sub-pixel SPX3 (see FIG. 16) emitting light of a third color (for example, blue).

The scan driver 120 may be disposed on a side 112 of the pixel part 110. The scan driver 120 may receive a first control signal SCS from the controller 140. The scan driver 120 may provide a scan signal to the sub-pixel SPX. The scan driver 120 may supply the scan signal to the scan lines SL in response to the first control signal SCS. For example, the scan signal may be provided to the sub-pixel SPX through a first scan line SL1 extending in a first direction DR1 and a second scan line SL2 extending in a second direction DR2.

The first control signal SCS may be a signal for controlling a driving timing of the scan driver 120. The first control signal SCS may include a scan start signal and clock signals for the scan signal. The scan signal may be set to a gate-on level corresponding to a type of a transistor to which the corresponding scan signal is supplied.

The data driver 130 may be disposed on a side 112 of the pixel part 110. The data driver 130 may receive a second control signal DCS from the controller 140. The data driver 130 may provide a data signal to the sub-pixel SPX. The data driver 130 may supply the data signal to the data line DL in response to the second control signal DCS. For example, a signal based on the second control signal DCS may be provided to the sub-pixel SPX through the data line DL.

The second control signal DCS may be a signal for controlling a driving timing of the data driver 130.

According to an embodiment, the display device 100 may further include a compensator (not shown). The compensator may receive a third control signal for sensing and compensating for a deterioration in the sub-pixels SPX from the controller 140. The compensator may receive a sensing value (current or voltage information) extracted from the sub-pixel SPX through a sensing line SENL (see FIG. 8). The compensator may generate a compensation value for compensating for a deterioration in the sub-pixel SPX based on the sensing value.

A single side driving structure in which the scan driver 120 and the data driver 130 are disposed on the side 112 of the pixel part 110 may be provided. The scan driver 120 and the data driver 130 may be disposed on a same side based on the pixel part 110. For example, in case that the display device 100 generally includes four sides, the scan driver 120 and the data driver 130 may be disposed adjacent to a same side of any one of the four sides.

According to an embodiment, in order to apply the single side driving structure of the display device 100, the scan line SL may include the first scan line SL1 and the second scan line SL2 extending in different directions.

The first scan line SL1 may extend in the first direction DR1 and may be electrically connected to the second scan line SL2 in a contact member CP. The first scan line SL1 may be electrically connected to the scan driver 120 and the second scan line SL2.

The second scan line SL2 may extend in the second direction DR2 and may be electrically connected to the sub-pixel SPX of a pixel row corresponding thereto. The second scan line SL2 may supply the scan signal to the sub-pixel SPX. Here, a pixel row direction may be a horizontal direction and may mean the second direction DR2, and a pixel column direction may be a vertical direction and may mean the first direction DR1. The pixel row may be defined by the second scan line SL2. The pixel row direction may be the same as (or substantially parallel to) a direction in which the side 112 of the pixel part 110 on which the scan driver 120 and the data driver 130 are disposed extends.

The second scan line SL2 may be connected to at least one first scan line SL1. For example, referring to a pixel row shown in an upper side of the pixel part 110 of FIG. 7, the second scan line SL2 may be electrically connected to any one of the first scan lines SL1 in an area, and may be electrically connected to another one of the first scan lines SL1 in another area.

The data line DL may extend along the pixel column (for example, in the first direction DR1) and may be electrically connected to the sub-pixel SPX. The data line DL may supply the data signal to the connected sub-pixel SPX.

FIG. 7 illustrates that the scan driver 120, the data driver 130, and the controller 140 are separated, but at least a portion of the scan driver 120, the data driver 130, and the controller 140 may be integrated into a module or integrated circuit chip (IC chip). For example, at least a portion of a configuration and/or a function of the controller 140 may be included in the data driver 130.

According to an embodiment, the scan driver 120 may be configured of scan drivers (for example, scan driving chips or scan driving circuits) respectively in charge of driving partial areas of the pixel part 110. The data driver 130 may be configured of data drivers (for example, data driving chips or data driving circuits) respectively in charge of driving some areas of the pixel part 110.

Figure 8:
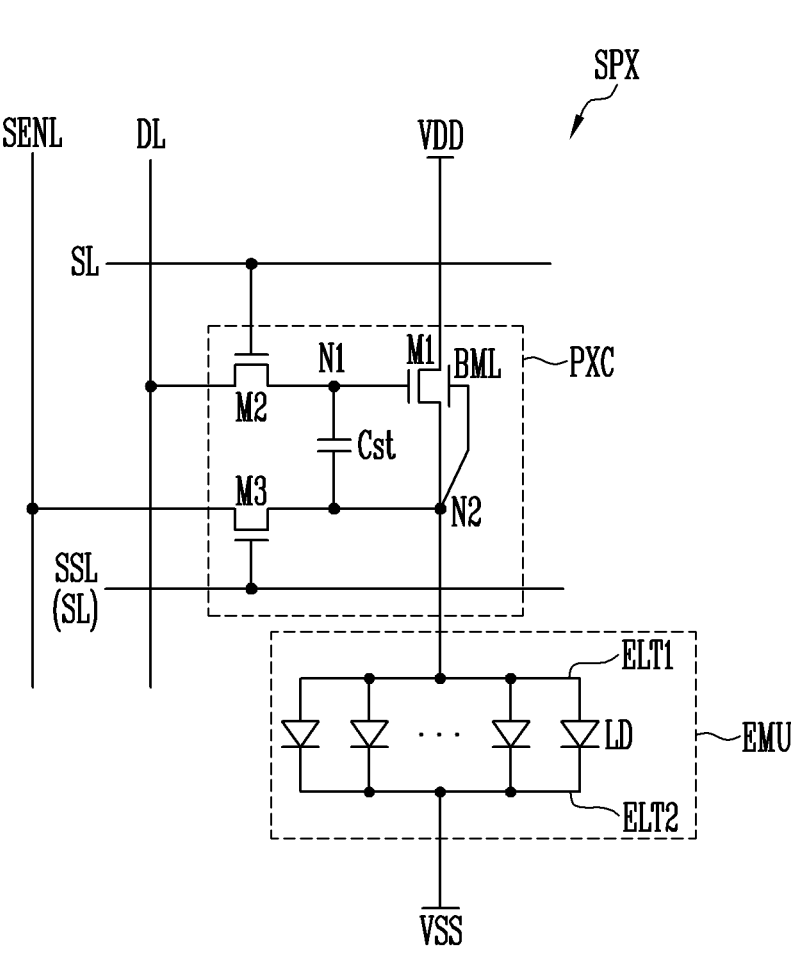
FIG. 8 is a schematic diagram of an equivalent circuit of a pixel circuit included in a sub-pixel according to an embodiment.

FIG. 8 is a schematic diagram illustrating a pixel circuit included in a sub-pixel according to an embodiment. The sub-pixel SPX of FIG. 8 may mean any one of the sub-pixels SPX described above with reference to FIG. 7.

Referring to FIG. 8, the sub-pixel SPX may include a pixel circuit PXC. The pixel circuit PXC may be configured to drive a light emitting part EMU.

The sub-pixel SPX may be electrically connected to the scan line SL, the data line DL, a first power line VDD, and a second power line VSS. Here, the scan line SL may refer to the above-described second scan line SL2. For convenience of description, the disclosure is described based on the scan line SL. According to an embodiment, the sub-pixel SPX may be further selectively connected to another power and/or signal line.

The sub-pixel SPX may include the light emitting part EMU configured to emit light corresponding to the data signal provided from the data line DL.

The pixel circuit PXC may be disposed between the first power line VDD and the light emitting part EMU. The pixel circuit PXC may be electrically connected to the scan line SL to which a first scan signal is supplied and the data line DL to which the data signal is supplied. The pixel circuit PXC may be electrically connected to a control line SSL to which a second scan signal is supplied, and may be electrically connected to reference power (or initialization power) or a sensing line SENL connected to a sensing circuit. According to an embodiment, the second scan signal may be the same as or different from the first scan signal. In case that the second scan signal is the same as the first scan signal, the control line SSL may be integral with the scan line SL.

The pixel circuit PXC may include at least one transistor and a capacitor. For example, the pixel circuit PXC may include a first transistor M1, a second transistor M2, a third transistor M3, and a capacitor Cst.

The first transistor M1 may be connected between the first power line VDD and a second node N2. The second node N2 may be a node to which the pixel circuit PXC and the light emitting part EMU are connected. For example, the second node N2 may be a node to which an electrode (for example, a source electrode) of the first transistor M1 and a first electrode (for example, an anode electrode) of the light emitting part EMU are connected. A gate electrode of the first transistor M1 may be connected to a first node N1. The first transistor M1 may control a driving current supplied to the light emitting part EMU in response to a voltage of the first node N1.

In an embodiment, the first transistor M1 may further include a bottom metal layer (BML) (or a back gate electrode). The gate electrode and the bottom metal layer BML of the first transistor M1 may overlap each other with an insulating layer interposed therebetween. In an embodiment, the bottom metal layer BML may be connected to an electrode of the first transistor M1, for example, a source electrode.

In the embodiment in which the first transistor M1 includes the bottom metal layer BML, a back-biasing technique (or a sync technique) for moving a threshold voltage of the first transistor M1 in a negative direction or a positive direction by applying a back-biasing voltage to the bottom metal layer BML of the first transistor M1 may be applied. In case that the bottom metal layer BML is disposed under a semiconductor pattern configuring a channel of the first transistor M1, light incident on the semiconductor pattern may be blocked to stabilize an operation characteristic of the first transistor M1.

The second transistor M2 may be connected between the data line DL and the first node N1. A gate electrode of the second transistor M2 may be connected to the scan line SL. The second transistor M2 may be turned on in case that a first scan signal having a gate-on voltage (for example, a high-level voltage) is supplied from the scan line SL, to connect the data line DL and the first node N1.

For each frame period, a data signal of a corresponding frame is supplied to the data line DL, and the data signal is transmitted to the first node N1 through the second transistor M2 during a period in which the first scan signal having the gate-on voltage is supplied. For example, the second transistor M2 may be a switching transistor for transmitting each data signal to an inside of the sub-pixel SPX.

An electrode of the capacitor Cst may be connected to the first node N1, and another electrode may be connected to the second node N2. The capacitor Cst is charged with a voltage corresponding to the data signal supplied to the first node N1 during each frame period.

The third transistor M3 may be connected between the second node N2 and the sensing line SENL. A gate electrode of the third transistor M3 may be connected to the control line SSL (or the scan line SL). The third transistor M3 may be turned on in case that a second scan signal (or a first scan signal) having a gate-on voltage (for example, a high-level voltage) is supplied from the control line SSL, to transmit a reference voltage (or an initialization voltage), supplied to the sensing line SENL, to the second node N2 or transmit a voltage of the second node N2 to the sensing line SENL. The voltage of the second node N2 transmitted to the sensing circuit through the sensing line SENL may be provided to an external circuit (for example, the controller 140) and used to compensate for characteristic deviation of the sub-pixels SPX.

FIG. 8 illustrates that all of the transistors included in the pixel circuit PXC are N-type transistors, but the disclosure is not limited thereto. For example, at least one of the first, second, and third transistors M1, M2, and M3 may be changed to a P-type transistor. A structure and a driving method of the sub-pixel SPX may be variously changed according to an embodiment.

The light emitting part EMU may include a first electrode ELT1, a second electrode ELT2, and at least one light emitting element LD connected between the first power line VDD and the second power line VSS. For example, the light emitting part EMU may include the first electrode ELT1 connected to the first power line VDD through the first transistor M1, the second electrode ELT2 connected to the second power line VSS, and at least one light emitting element LD connected between the first electrode ELT1 and the second electrode ELT2. In an embodiment, the light emitting part EMU may include light emitting elements LD connected in parallel between the first electrode ELT1 and the second electrode ELT2.

Power of the first power line VDD and power of the second power line VSS may have different potentials. For example, the power of the first power line VDD may be a high-potential pixel power, and the power of the second power line VSS may be a low-potential pixel power. A potential difference between the power of the first power line VDD and the power of the second power line VSS may be set to be greater than or equal to a threshold voltage of the light emitting elements LD.

Each light emitting element LD may be connected in a forward direction between the first power line VDD and the second power line VSS to configure each effective light source. Such effective light sources may collectively configure the light emitting part EMU of the sub-pixel SPX.

The light emitting elements LD may emit light with a luminance corresponding to a driving current supplied through the pixel circuit PXC. During each frame period, the pixel circuit PXC may supply the driving current, corresponding to the data signal, to the light emitting part EMU. The driving current supplied to the light emitting part EMU may be divided and may flow through the light emitting elements LD. Accordingly, each light emitting element LD may emit light with a luminance corresponding to the current flowing therethrough, and the light emitting part EMU may emit light with the luminance corresponding to the driving current.

FIG. 8 illustrates an embodiment in which the sub-pixel SPX includes the light emitting part EMU having a parallel structure, but the disclosure is not limited thereto. For example, the sub-pixel SPX may include a light emitting part EMU having a series structure or a series/parallel structure. The light emitting part EMU may include light emitting elements LD connected in series or in series/parallel between the first electrode ELT1 and the second electrode ELT2. As another example, the sub-pixel SPX may include only a single light emitting element LD connected between the first electrode ELT1 and the second electrode ELT2.

The pixel circuit PXC for the sub-pixel SPX according to an embodiment is not limited to the above-described example. Hereinafter, a pixel circuit PXC according to an embodiment is described with reference to FIG. 9. Contents that may overlap the contents described above are omitted or the description is simplified.

Figure 9:
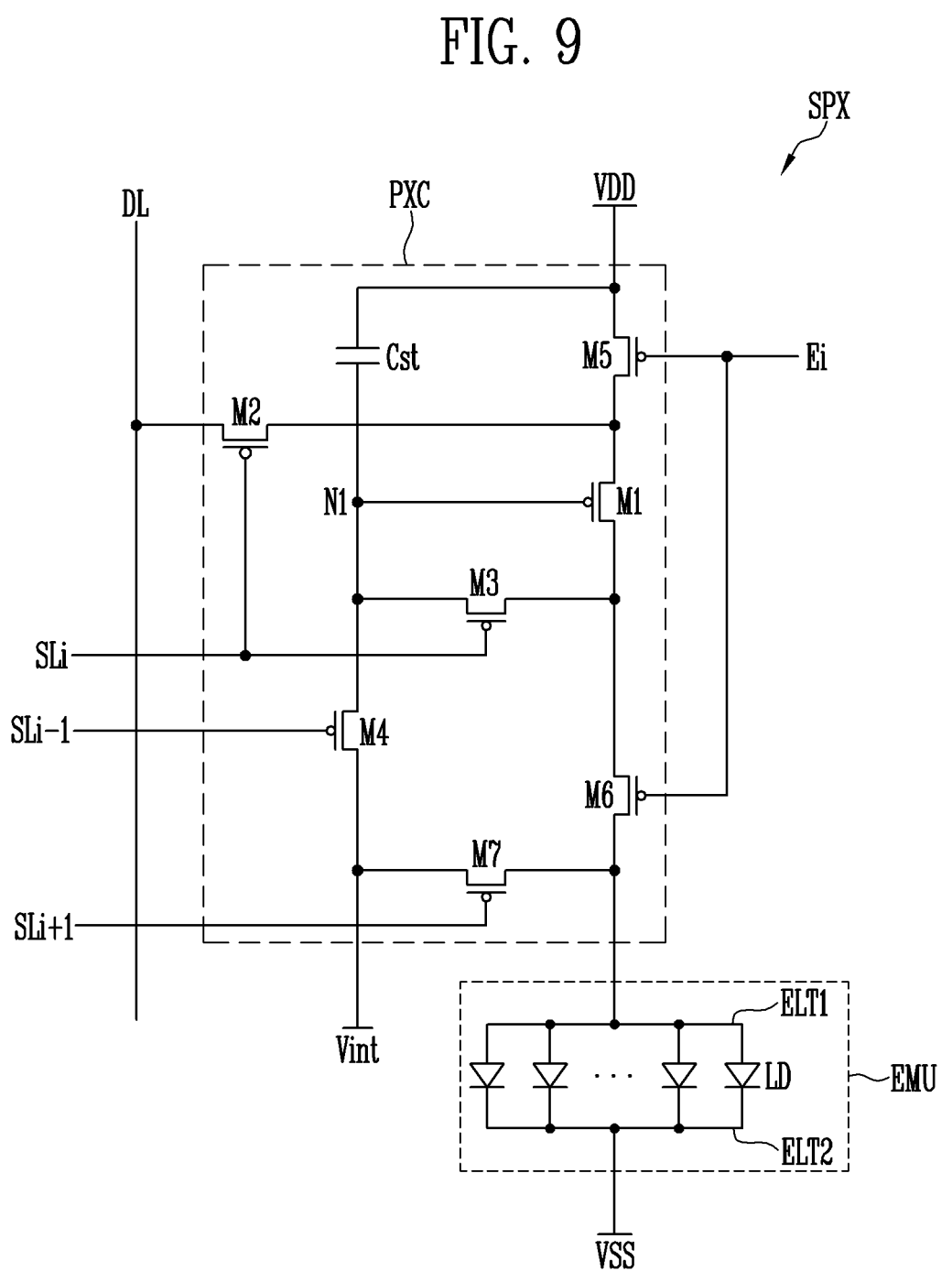

FIG. 9 is a schematic diagram illustrating a pixel circuit included in a sub-pixel according to another embodiment. The sub-pixel SPX of FIG. 9 may mean any one of the sub-pixels SPX described above with reference to FIG. 7.

Referring to FIG. 9, the sub-pixel SPX may include a pixel circuit PXC. The pixel circuit PXC may be configured to drive the light emitting part EMU.

The pixel circuit PXC may include first to seventh transistors M1 to M7 and a storage capacitor Cst. The pixel circuit PXC may be electrically connected to the light emitting part EMU. The pixel circuit PXC may be electrically connected to the light emitting element LD.

An electrode of the first transistor M1 may be connected to the first power line VDD via the fifth transistor M5, and another electrode of the first transistor M1 may be connected to the first electrode ELT1 (for example, the anode electrode) of the light emitting part EMU via the sixth transistor M6. The first transistor M1 may control current data flowing from the first power line VDD to the second power line VSS via the light emitting part EMU based on information on a voltage of a first node N1. The first transistor M1 may be a driving transistor.

The second transistor M2 may be connected between the electrode of the first transistor M1 and the data line DL. A gate electrode of the second transistor M2 may be connected to an i-th scan line SLi. The second transistor M2 may be turned on in case that the scan signal is applied from the i-th scan line SLi, and may electrically connect the data line DL and the electrode of the first transistor M1. The second transistor M2 may be a switching transistor.

The third transistor M3 may be connected between the other electrode of the first transistor M1 and the first node N1. The third transistor M3 may be turned on in case that a scan signal having a gate-on voltage is applied from the i-th scan line SLi, and may electrically connect the other electrode of the first transistor M1 and the first node N1. In case that the third transistor M3 is turned on, the first transistor M1 may be connected in diode form.

The fourth transistor M4 may be connected between the first node N1 and an initialization power line Vint. A gate electrode of the fourth transistor M4 may be connected to an (i−1)-th scan line SLi−1. The fourth transistor M4 may be turned on in case that the scan signal is applied to the (i−1)-th scan line SLi−1, to supply a voltage of the initialization power line Vint to the first node N1. The fourth transistor M4 may be an initialization transistor.

The fifth transistor M5 may be connected between the first power line VDD and the first transistor M1. A gate electrode of the fifth transistor M5 may be connected to an i-th emission control line Ei. The fifth transistor M5 may be turned off in case that an emission control signal having a gate-off voltage is applied from the i-th emission control line Ei, and may be turned on in other cases.

The sixth transistor M6 may be connected between the first transistor M1 and the light emitting part EMU. A gate electrode of the sixth transistor M6 may be connected to the i-th emission control line Ei. The sixth transistor M6 may be turned off in case that the emission control signal having the gate-off voltage (for example, a high-level voltage) is applied from the i-th emission control line Ei, and may be turned on in other cases.

The seventh transistor M7 may be connected between the initialization power line Vint and the first electrode ELT1 (for example, the anode electrode) of the light emitting part EMU. A gate electrode of the seventh transistor M7 may be connected to an (i+1)-th scan line SLi+1. The seventh transistor M7 may be turned on in case that a scan signal having a gate-on voltage (for example, a low-level voltage) is applied from the (i+1)-th scan line SLi+1, to supply a voltage of the initialization power line Vint to the first electrode ELT1 of the light emitting part EMU. A signal applied to the gate electrode of the seventh transistor M7 may be a signal having the same timing as the scan signal having the gate-on voltage applied from the i-th scan line SLi.

The voltage of the initialization power line Vint may be set to a voltage lower than that of the data signal. For example, the voltage of the initialization power line Vint may be set to be less than or equal to the lowest voltage of the data signal.

The storage capacitor Cst may be connected between the first power line VDD and the first node N1. The storage capacitor Cst may store information on the data signal and a voltage corresponding to a threshold voltage of the first transistor M1.

The first electrode ELT1 of the light emitting part EMU may be connected to the first transistor M1 via the sixth transistor M6. The second electrode ELT2 (for example, a cathode electrode) of the light emitting part EMU may be connected to the second power line VSS.

Figure 10:
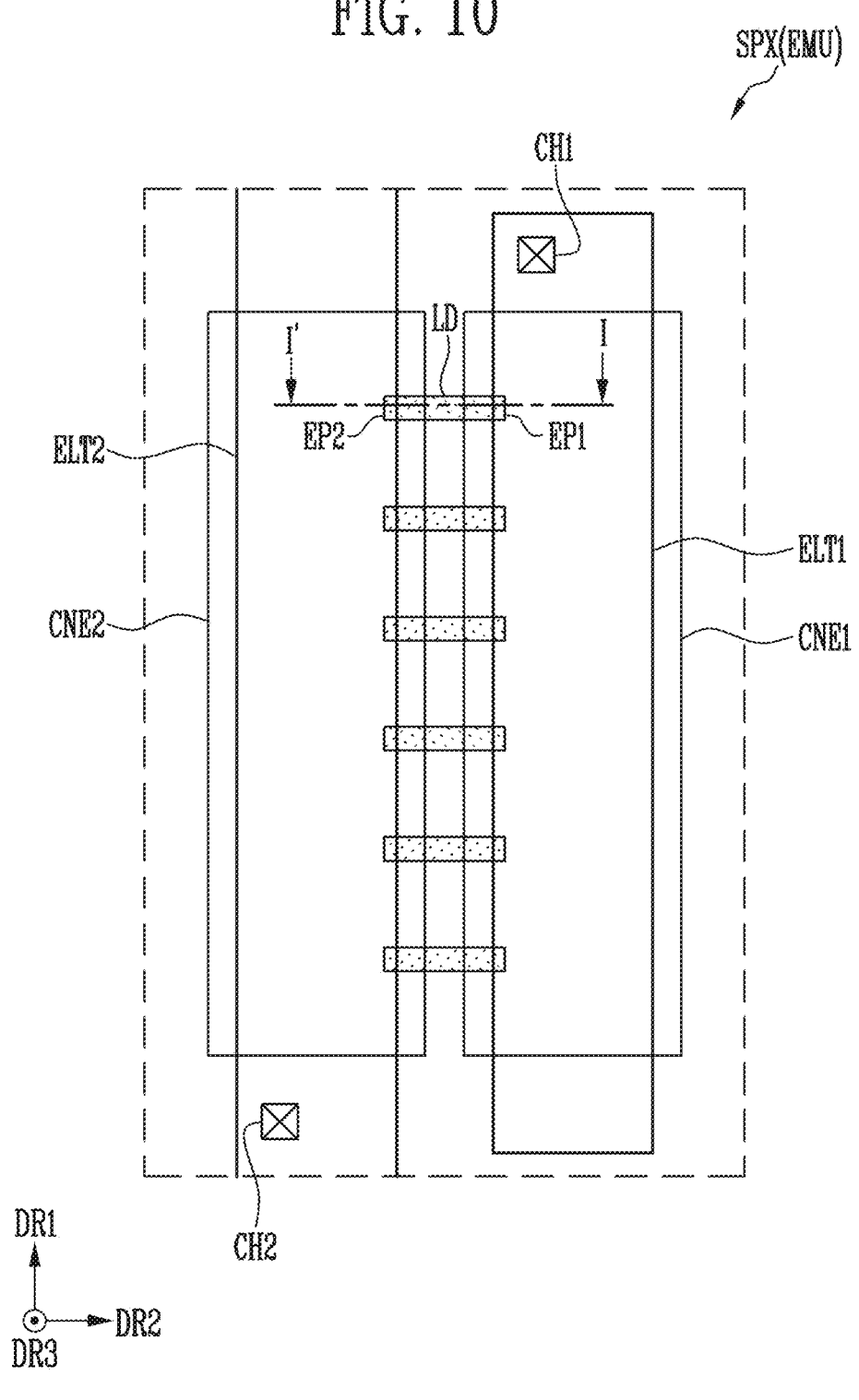
FIG. 10 is a schematic plan view illustrating a sub-pixel according to an embodiment.

Hereinafter, a structure of the sub-pixel SPXL is described with reference to FIGS. 10 and 11. FIG. 10 is a schematic plan view illustrating a sub-pixel according to an embodiment. For example, FIG. 10 schematically illustrates the light emitting part EMU of the sub-pixel SPX FIG. 10 illustrates an embodiment of the light emitting part EMU including the first electrode ELT1, the second electrode ELT2, and the light emitting elements LD connected in parallel between the first electrode ELT1 and the second electrode ELT2 as shown in FIG. 8.

FIG. 10 illustrates an embodiment in which the light emitting part EMU is connected to power lines (for example, the first power line VDD and the second power line VSS), a circuit element (for example, at least one circuit element configuring the pixel circuit PXC of the sub-pixel SPX as a component included in a pixel circuit layer PCL (see FIG. 11)), and/or a signal line (for example, the scan line SL and/or the data line DL), through first and second contact holes CH1 and CH2. However, in an embodiment, at least one of the first and second electrodes ELT1 and ELT2 of each sub-pixel SPX may be directly connected to the power and/or signal line without passing through a contact hole, an intermediate line, and/or the like.

Referring to FIG. 10, the light emitting part EMU may include the first electrode ELT1, the second electrode ELT2, and the light emitting elements LD disposed and/or aligned between the first and second electrodes ELT1 and ELT2. The words "the light emitting elements LD are disposed and/or aligned between the first and second electrodes ELT1 and ELT2" may mean that at least one area of each of the light emitting elements LD is positioned in an area between the first and second electrodes ELT1 and ELT2 in a plan view.

The light emitting part EMU may further include a first contact electrode CNE1 and a second contact electrode CNE2 connected to the light emitting elements LD.

The first electrode ELT1 and the second electrode ELT2 may be spaced apart from each other. For example, the first electrode ELT1 and the second electrode ELT2 may be spaced apart from each other in the second direction DR2 in each emission area (for example, emission areas of each sub-pixel SPX), and each of the first electrode ELT1 and the second electrode ELT2 may extend in the first direction DR1.

FIG. 10 illustrates an embodiment in which the light emitting part EMU includes each of a first electrode ELT1 and a second electrode ELT2, but the disclosure is not limited thereto. For example, the number of the first electrodes ELT1 and/or the second electrodes ELT2 provided to each light emitting part EMU may be changed. In case that first electrodes ELT1 are disposed in a light emitting part EMU, the first electrodes ELT1 may be integral or non-integral with each other. Similarly, in case that second electrodes ELT2 are disposed in one light emitting part EMU, the second electrodes ELT2 may be integral or non-integral with each other (or may be integrally or non-integrally connected to each other).

Each of the first electrode ELT1 and the second electrode ELT2 may have a pattern separated for each sub-pixel SPX or may have a commonly connected pattern in the sub-pixels SPX. For example, the first electrode ELT1 may have an independent pattern for each sub-pixel SPX, and may be separated from the first electrodes ELT1 of neighboring sub-pixels SPX. The second electrode ELT2 may have an independent pattern for each sub-pixel SPX or may be integral with the second electrodes ELT2 of adjacent sub-pixels SPX.

Before a process of forming the sub-pixels SPX, in particular, an alignment of the light emitting elements LD is completed, the first electrodes ELT1 of the sub-pixels SPX may be connected to each other, and the second electrodes ELT2 of the sub-pixels SPX may be connected to each other. For example, before the alignment of the light emitting elements LD is completed, the first electrodes ELT1 of the sub-pixels SPX may be integral or non-integral with each other to form a first alignment line, and the second electrodes ELT2 of the sub-pixels SPX may be integral or non-integral with each other to form a second alignment line.

The first alignment line and the second alignment line may respectively receive a first alignment signal and a second alignment signal in a step of aligning the light emitting elements LD. The first and second alignment signals may have different waveforms, potentials, and/or phases. Accordingly, an electric field may be formed between the first and second alignment lines, and thus the light emitting elements LD may be aligned between the first and second alignment lines. After the alignment of the light emitting elements LD is completed, at least the first alignment line may be cut to separate the first electrodes ELT1 of the sub-pixels SPX from each other. Accordingly, the sub-pixels SPX may be individually driven.

The first electrode ELT1 may be electrically connected to at least one circuit element (for example, at least one transistor configuring the pixel circuit PXC), a power line (for example, the first power line VDD), and/or a signal line (for example, the scan line SL, the data line DL, or a control line) through the first contact hole CH1. In an embodiment, the first electrode ELT1 may be directly connected to a power or signal line. In an embodiment, the first electrode ELT1 may be connected to the first transistor M1 of the pixel circuit PXC through the first contact hole CH1 and may be connected to the first power line VDD through the first transistor M1.

The second electrode ELT2 may be electrically connected to at least one circuit element (for example, at least one transistor configuring the pixel circuit PXC), a power line (for example, the second power line VSS), and/or a signal line (for example, the scan line SL, the data line DL, or a control line) through the second contact hole CH2. In an embodiment, the second electrode ELT2 may be directly connected to a power line or signal line. In an embodiment, the second electrode ELT2 may be connected to the second power line VSS through the second contact hole CH2.

Each of the first and second electrodes ELT1 and ELT2 may be configured as a single layer or multiple layers. For example, each of the first and second electrodes ELT1 and ELT2 may include at least one reflective electrode layer including a reflective conductive material, and may selectively further include at least one transparent electrode layer and/or at least one conductive capping layer.

The light emitting elements LD may be aligned between the first electrode ELT1 and the second electrode ELT2. For example, the light emitting elements LD may be aligned and/or connected in parallel with each other between the first electrode ELT1 and the second electrode ELT2.

In an embodiment, each light emitting element LD may be aligned in the second direction DR2 between the first electrode ELT1 and the second electrode ELT2, and may be electrically connected to the first and second electrodes ELT1 and ELT2. FIG. 10 illustrates that all of the light emitting elements LD are uniformly aligned in the second direction DR2, but the disclosure is not limited thereto. For example, at least one of the light emitting elements LD may be arranged in an oblique direction or the like inclined with respect to an extension direction of the first and second electrodes ELT1 and ELT2.

The first end EP1 of the light emitting element LD may be disposed adjacent to the first electrode ELT1, and the second end EP2 of the light emitting element LD may be disposed adjacent to the second electrode ELT2. The first end EP1 may or may not overlap the first electrode ELT1. The second end EP2 may or may not overlap the second electrode ELT2.

In an embodiment, the first end EP1 of each of the light emitting elements LD may be electrically connected to the first electrode ELT1 through the first contact electrode CNE1. In an embodiment, the first end EP1 of each of the light emitting elements LD may be directly connected to the first electrode ELT1. In an embodiment, the first end EP1 of each of the light emitting elements LD may be electrically connected to only the first contact electrode CNE1 and may not be connected to the first electrode ELT1. The first contact electrode CNE1 may configure the anode electrode of the light emitting part EMU, and the light emitting elements LD may be connected to the corresponding pixel circuit PXC through the first contact electrode CNE1.

Similarly, the second end EP2 of each of the light emitting elements LD may be electrically connected to the second electrode ELT2 through the second contact electrode CNE2. In an embodiment, the second end EP2 of each of the light emitting elements LD may be directly connected to the second electrode ELT2. In an embodiment, the second end EP2 of each of the light emitting elements LD may be electrically connected to only the second contact electrode CNE2 and may not be connected to the second electrode ELT2. The second contact electrode CNE2 may configure the cathode electrode of the light emitting part EMU, and the light emitting elements LD may be connected to the second power line VSS by the second contact electrode CNE2.

The light emitting elements LD may be provided (or prepared) in a dispersed form in a solution, and may be supplied to the emission area of each sub-pixel SPX by an inkjet printing method, a slit coating method, or the like. In case that alignment signals are applied to the first and second electrodes ELT1 and ELT2 (or first and second alignment lines) of the sub-pixels SPX in a state in which the light emitting elements LD are supplied to each emission area, the light emitting elements LD are aligned between the first and second electrodes ELT1 and ELT2. After the light emitting elements LD are aligned, a solvent may be removed by a drying process or the like.

The first contact electrode CNE1 and the second contact electrode CNE2 may be respectively disposed on the first ends EP1 and the second ends EP2 of the light emitting elements LD.

The first contact electrode CNE1 may be disposed on the first ends EP1 to be electrically connected to the first ends EP1 of the light emitting elements LD. In an embodiment, the first contact electrode CNE1 may be disposed on the first electrode ELT1 to be electrically connected to the first electrode ELT1. The first ends EP1 of the light emitting elements LD may be connected to the first electrode ELT1 by the first contact electrode CNE1.

The second contact electrode CNE2 may be disposed on the second ends EP2 to be electrically connected to the second ends EP2 of the light emitting elements LD. In an embodiment, the second contact electrode CNE2 may be disposed on the second electrode ELT2 to be electrically connected to the second electrode ELT2. The second ends EP2 of the light emitting elements LD may be connected to the second electrode ELT2 by the second contact electrode CNE2.

Hereinafter, the disclosure is described based on a cross-sectional structure of the sub-pixel SPX (or the light emitting part EMU) according to an embodiment with reference to FIG. 11. FIG. 11 is a schematic cross-sectional view taken along line I-I' of FIG. 10.

Figure 11:
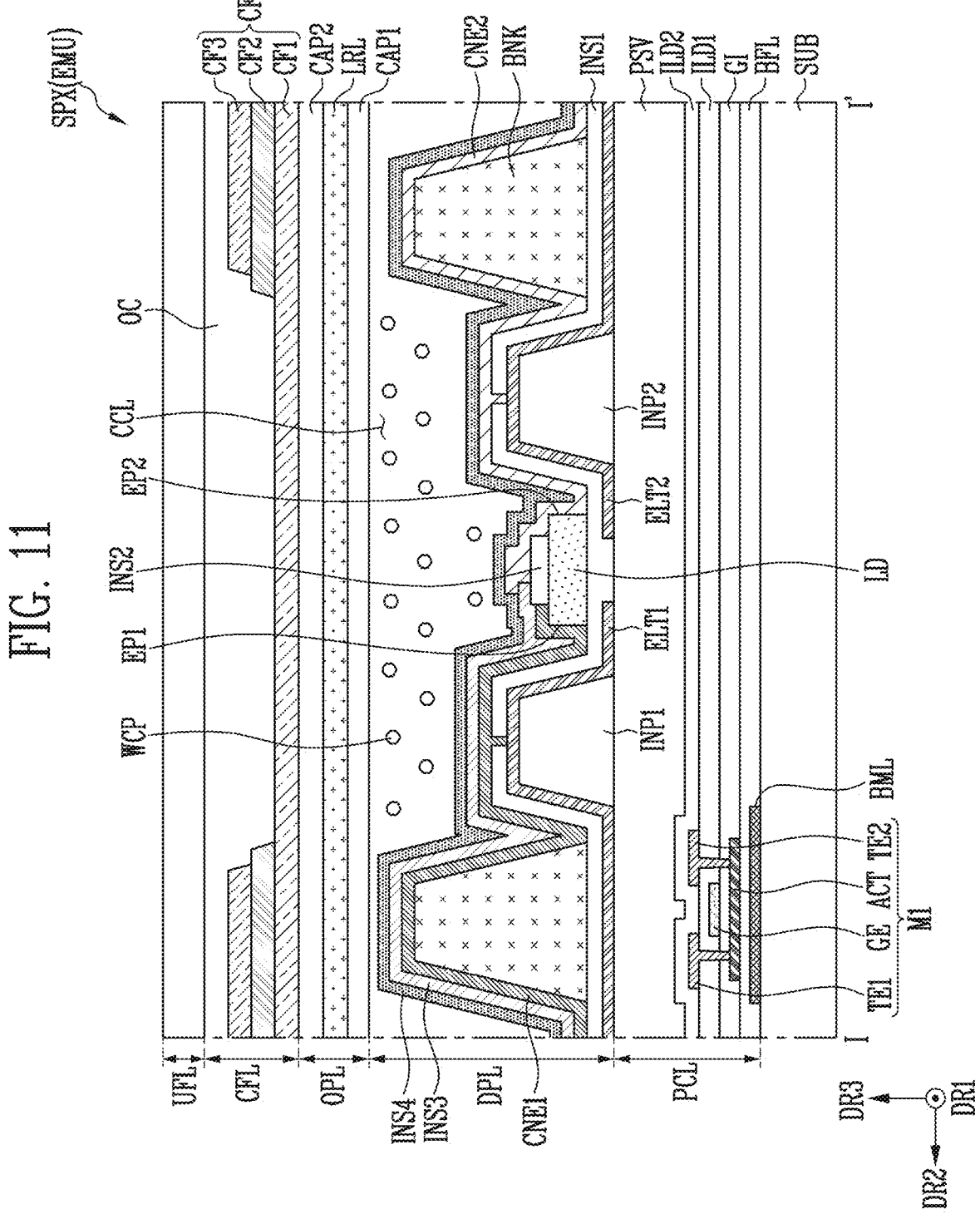
FIG. 11 is a schematic cross-sectional view taken along line I-I' of FIG. 10.

Referring to FIG. 11, the sub-pixel SPX may include a substrate SUB, a pixel circuit layer PCL, a display element layer DPL, an optical layer OPL, a color filter layer CFL, and an upper film layer UFL.

The substrate SUB may form (or configure) a base member of the sub-pixel SPX. The substrate SUB may provide an area in which the pixel circuit layer PCL and the display element layer DPL may be disposed.

The pixel circuit layer PCL may be disposed on the substrate SUB. The pixel circuit layer PCL may include a bottom metal layer BML, a buffer layer BFL, the first transistor M1, a gate insulating layer GI, a first interlayer insulating layer ILD1, a second interlayer insulating layer ILD2, and a protective layer PSV. FIG. 11 illustrates only the first transistor M1 among the circuit elements for convenience of description.

The bottom metal layer BML may be disposed on the substrate SUB. The bottom metal layer BML may function as a path through which an electrical signal moves. According to an embodiment, a portion of the bottom metal layer BML may overlap the first transistor M1 in a plan view.

The buffer layer BFL may be disposed on the substrate SUB. The buffer layer BFL may cover the bottom metal layer BML. The buffer layer BFL may prevent an impurity from diffusing from the outside. The buffer layer BFL may include a material among silicon oxide ($SiO_x$), silicon nitride ($SiN_x$), silicon oxynitride ($SiO_xN_y$), aluminum oxide ($AlO_x$), and titanium oxide ($TiO_x$).

The first transistor M1 may be a thin-film transistor. According to an embodiment, the first transistor M1 may be a driving transistor. The first transistor M1 may be electrically connected to the light emitting element LD.

The first transistor M1 may include the active layer ACT, a first transistor electrode TE1, a second transistor electrode TE2, and a gate electrode GE.

The active layer ACT may refer to a semiconductor layer. The active layer ACT may be disposed on the buffer layer BFL. The active layer ACT may include one of polysilicon, low-temperature polycrystalline silicon (LTPS), amorphous silicon, and an oxide semiconductor.

The active layer ACT may include a first contact region contacting the first transistor electrode TE1 and a second contact region contacting the second transistor electrode TE2. The first contact region and the second contact region may be semiconductor patterns doped with impurities. A region between the first contact region and the second contact region may be a channel region. The channel region may be an intrinsic semiconductor pattern that is not doped with an impurity.

The gate electrode GE may be disposed on the gate insulating layer GI. A position of the gate electrode GE may correspond to a position of the channel region of the active layer ACT. For example, the gate electrode GE may be disposed on the channel region of the active layer ACT with the gate insulating layer GI interposed therebetween.

The gate insulating layer GI may be disposed on the active layer ACT. The gate insulating layer GI may include one of silicon oxide ($SiO_x$), silicon nitride ($SiN_x$), silicon oxynitride ($SiO_xN_y$), aluminum oxide ($AlO_x$), and titanium oxide ($TiO_x$).

The first interlayer insulating layer ILD1 may be disposed on the gate electrode GE. The first interlayer insulating layer ILD1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The first transistor electrode TE1 and the second transistor electrode TE2 may be disposed on the first interlayer insulating layer ILD1. The first transistor electrode TE1 may contact the first contact region of the active layer ACT by passing through the gate insulating layer GI and the first interlayer insulating layer ILD1, and the second transistor electrode TE2 may contact the second contact region of the active layer ACT by passing through the gate insulating layer GI and the first interlayer insulating layer ILD1. For example, the first transistor electrode TE1 may be a drain electrode, and the second transistor electrode TE2 may be a source electrode, but the disclosure is not limited thereto.

The first transistor electrode TE1 may be electrically connected to the first electrode ELT1 through a contact hole formed in the protective layer PSV.

The second interlayer insulating layer ILD2 may be disposed on the first transistor electrode TE1 and the second transistor electrode TE2. The second interlayer insulating layer ILD2 may include one of silicon oxide ($SiO_x$), silicon nitride ($SiN_x$), silicon oxynitride ($SiO_xN_y$), aluminum oxide ($AlO_x$), and titanium oxide ($TiO_x$).

The protective layer PSV may be disposed on the second interlayer insulating layer ILD2. The protective layer PSV may include an organic material and/or an inorganic material.

The display element layer DPL may be disposed on the pixel circuit layer PCL. The display element layer DPL may include a first insulating pattern INP1, a second insulating pattern INP2, the first electrode ELT1, the second electrode ELT2, a first insulating layer INS1, the light emitting element LD, a second insulating layer INS2, the first contact electrode CNE1, the second contact electrode CNE2, a third insulating layer INS3, and a fourth insulating layer INS4.

The first insulating pattern INP1 and the second insulating pattern INP2 may be disposed on the protective layer PSV. The first insulating pattern INP1 and the second insulating pattern INP2 may have a shape protruding in a thickness direction (for example, a third direction DR3) of the substrate SUB. The first insulating pattern INP1 and the second insulating pattern INP2 may include an organic material and/or an inorganic material.

The first electrode ELT1 and the second electrode ELT2 may be disposed on the protective layer PSV. According to an embodiment, at least a portion of the first electrode ELT1 may be arranged on the first insulating pattern INP1, at least a portion of the second electrode ELT2 may be arranged on the second insulating pattern INP2, and thus each of the first electrode ELT1 and the second electrode ELT2 may function as a reflective partition wall.

The first electrode ELT1 may be electrically connected to the light emitting element LD. The first electrode ELT1 may be electrically connected to the first contact electrode CNE1 through a contact hole formed in the first insulating layer INS1. The first electrode ELT1 may provide an anode signal to the light emitting element LD.

The second electrode ELT2 may be electrically connected to the light emitting element LD. The second electrode ELT2 may be electrically connected to the second contact electrode CNE2 through a contact hole formed in the first insulating layer INS1. The second electrode ELT2 may provide a cathode signal (for example, a ground signal) to the light emitting element LD.

The first electrode ELT1 and the second electrode ELT2 may include a conductive material. For example, the first electrode ELT1 and the second electrode ELT2 may include one of silver (Ag), magnesium (Mg), aluminum (Al), platinum (Pt), palladium (Pd), gold (Au), nickel (Ni), neodymium (Nd), iridium (Ir), chromium (Cr), titanium (Ti), and an alloy thereof. However, the first electrode ELT1 and the second electrode ELT2 are not limited to the above-described example.

The first insulating layer INS1 may be disposed on the protective layer PSV. The first insulating layer INS1 may cover the first electrode ELT1 and the second electrode ELT2. The first insulating layer INS1 may stabilize connection between electrode configurations and reduce an external influence. The first insulating layer INS1 may include one of silicon oxide ($SiO_x$), silicon nitride ($SiN_x$), silicon oxynitride ($SiO_xN_y$), aluminum oxide ($AlO_x$), and titanium oxide ($TiO_x$).

The light emitting element LD may be disposed on the first insulating layer INS1. The light emitting element LD may emit light based on an electrical signal provided from the first contact electrode CNE1 and the second contact electrode CNE2. According to an embodiment, the light emitting element LD may emit light of a third color (for example, blue). A color conversion part CCL and the color filter layer CFL may be provided to such sub-pixels SPX to display a full-color image. However, the disclosure is not limited thereto, and the light emitting elements LD emitting light of different colors may be provided to the sub-pixels SPX, respectively.

A portion of the second insulating layer INS2 may be disposed on the light emitting element LD. The second insulating layer INS2 may cover the active layer ACT of the light emitting element LD. The second insulating layer INS2 may include an organic material or an inorganic material.

According to an embodiment, the second insulating layer INS2 may expose at least a portion of the light emitting element LD. For example, the second insulating layer INS2 may not cover the first end EP1 and the second end EP2 of the light emitting element LD, and thus the first end EP1 and the second end EP2 of the light emitting element LD may be exposed, and may be electrically connected to the first contact electrode CNE1 and the second contact electrode CNE2, respectively.

The first contact electrode CNE1 and the second contact electrode CNE2 may be disposed on the first insulating layer INS1. According to an embodiment, the first contact electrode CNE1 may be disposed on the first insulating layer INS1 and the second insulating layer INS2, and the second contact electrode CNE2 may be disposed on the first insulating layer INS1 and the second insulating layer INS2.

The first contact electrode CNE1 may electrically connect the first electrode ELT1 and the light emitting element LD, and the second contact electrode CNE2 may electrically connect the second electrode ELT2 and the light emitting element LD.

The first contact electrode CNE1 and the second contact electrode CNE2 may include a conductive material. For example, the first contact electrode CNE1 and the second contact electrode CNE2 may include a transparent conductive material including one of indium tin oxide (ITO), indium zinc oxide (IZO), and indium tin zinc oxide (ITZO). However, the first contact electrode CNE1 and the second contact electrode CNE2 are not limited to the above-described example.

The third insulating layer INS3 may be disposed on the first contact electrode CNE1 and the second insulating layer INS2. At least a portion of the third insulating layer INS3 may be disposed between the first contact electrode CNE1 and the second contact electrode CNE2 to prevent an electrical short. The third insulating layer INS3 may include one of silicon oxide ($SiO_x$), silicon nitride ($SiN_x$), silicon oxynitride ($SiO_xN_y$), aluminum oxide ($AlO_x$), and titanium oxide ($TiO_x$).

The fourth insulating layer INS4 may be disposed on the third insulating layer INS3 and the second contact electrode CNE2. The fourth insulating layer INS4 may protect configurations of the display element layer DPL. The fourth insulating layer INS4 may include one of silicon oxide ($SiO_x$), silicon nitride ($SiN_x$), silicon oxynitride ($SiO_xN_y$), aluminum oxide ($AlO_x$), and titanium oxide ($TiO_x$).

According to an embodiment, the display element layer DPL may further include the color conversion part CCL. However, the display element layer DPL is not limited to the above-described example, and according to an embodiment, the color conversion part CCL and the display element layer DPL may be separately provided on different layers.

The color conversion part CCL may change a wavelength of light provided from the light emitting element LD or transmit light provided from the light emitting element LD.

For example, in case that the sub-pixel SPX is a first sub-pixel SPX1 emitting light of a first color (for example, red), a wavelength conversion pattern WCP of the color conversion part CCL may include first color conversion particles for converting the light of the third color into the light of the first color. The first color conversion particles may include a first quantum dot converting blue light into red light. The first quantum dot may absorb the blue light and shift a wavelength according to an energy transition to emit the red light.

As another example, in case that the sub-pixel SPX is a second sub-pixel SPX2 emitting light of a second color (for example, green), the wavelength conversion pattern WCP of the color conversion part CCL may include second color conversion particles converting the light of the third color into light of a second color. The second color conversion particles may include a second quantum dot converting the blue light into green light. The second quantum dot may absorb the blue light and shift a wavelength according to an energy transition to emit the green light.

The first quantum dot and the second quantum dot may have a spherical shape, a pyramidal shape, a multi-arm shape, a shape of a cubic nanoparticle, nanotube, nanowire, nanofiber, or nanoplate-like particle, or the like, but are not limited thereto, and the shape of the first quantum dot and the second quantum dot may be variously changed.

As another example, in case that the sub-pixel SPX is a third sub-pixel SPX3 emitting the light of the third color (for example, blue), the color conversion part CCL may include a light transmission pattern (not shown). The light transmission pattern may be for efficiently using the light emitted from the light emitting element LD, and may include light scattering particles dispersed in a matrix material such as a base resin. For example, the light transmission pattern may include light scattering particles such as silica, but a material of the light scattering particles is not limited thereto.

The optical layer OPL may be disposed on the display element layer DPL. According to an embodiment, the optical layer OPL may include a first capping layer CAP1, a low refractive layer LRL, and a second capping layer CAP2.

The first capping layer CAP1 may seal (or cover) the color conversion part CCL. The first capping layer CAP1 may be disposed between the low refractive layer LRL and the display element layer DPL. The first capping layer CAP1 may be provided over the sub-pixels SPX. The first capping layer CAP1 may prevent an impurity such as moisture or air from penetrating from the outside and damaging or contaminating the color conversion part CCL.

According to an embodiment, the first capping layer CAP1 may include one of silicon nitride (SiN$_x$), silicon oxide (SiO$_x$), silicon oxynitride (SiO$_x$N$_y$), and aluminum oxide (AlO$_x$).

The low refractive layer LRL may be disposed between the first capping layer CAP1 and the second capping layer CAP2. The low refractive layer LRL may be disposed between the color conversion part CCL and the color filter layer CFL. The low refractive layer LRL may be provided over the sub-pixels SPX.

The low refractive layer LRL may improve light efficiency by recycling light provided from the color conversion part CCL. To this end, the low refractive layer LRL may have a refractive index lower than that of the color conversion part CCL.

According to an embodiment, the low refractive layer LRL may include a base resin and a hollow particle dispersed in the base resin. The hollow particle may include a hollow silica particle. As another example, the hollow particle may be a pore formed by porogen, but is not limited thereto. The low refractive layer LRL may include one of zinc oxide (ZnO$_x$), titanium oxide (TiO$_x$), and a nano silicate particle, but is not limited thereto.

The second capping layer CAP2 may be disposed on the low refractive layer LRL. The second capping layer CAP2 may be disposed between the color filter layer CFL and the low refractive layer LRL. The second capping layer CAP2 may be provided over the sub-pixels SPX. The second capping layer CAP2 may prevent an impurity such as moisture or air from penetrating from the outside and damaging or contaminating the low refractive layer LRL.

According to an embodiment, the second capping layer CAP2 may include one of silicon nitride (SiN$_x$), silicon oxide (SiO$_x$), silicon oxynitride (SiO$_x$N$_y$), and aluminum oxide (AlO$_x$).

The color filter layer CFL may be disposed on the second capping layer CAP2. The color filter layer CFL may be provided over the sub-pixels SPX. The color filter layer CFL may include color filters CF (e.g., CF1, CF2, and CF3) and an overcoat layer OC.

The color filters CF1, CF2, and CF3 may be disposed on the second capping layer CAP2.

According to an embodiment, in case that the sub-pixel SPX is the first sub-pixel SPX1 emitting the light of the first color, an emission area from which the light of the light emitting element LD is emitted may overlap a first color filter CF1 and may not overlap a second color filter CF2 and a third color filter CF3 in a plan view. FIG. 11 illustrates an embodiment in which the sub-pixel SPX is the first sub-pixel SPX1.

According to an embodiment, in case that the sub-pixel SPX is the second sub-pixel SPX2 emitting the light of the second color, the emission area from which the light of the light emitting element LD is emitted may overlap the second color filter CF2 and may not overlap the first color filter CF1 and the third color filter CF3 in a plan view.

According to an embodiment, in case that the sub-pixel SPX is the third sub-pixel SPX3 emitting the light of the third color, the emission area from which the light of the light emitting element LD is emitted may overlap the third color filter CF3 and may not overlap the first color filter CF1 and the second color filter CF2 in a plan view.

The first color filter CF1 may transmit the light of the first color, and may not transmit the light of the second color and the light of the third color. For example, the first color filter CF1 may include a colorant related to the first color.

The second color filter CF2 may transmit the light of the second color, and may not transmit the light of the first color and the light of the third color. For example, the second color filter CF2 may include a colorant related to the second color.

The third color filter CF3 may transmit the light of the third color, and may not transmit the light of the first color and the light of the second color. For example, the third color filter CF3 may include a colorant related to the third color.

The overcoat layer OC may be disposed on the color filters CF1, CF2, and CF3. The overcoat layer OC may be provided over the sub-pixels SPX. The overcoat layer OC may cover a lower member including the color filters CF1, CF2, and CF3. The overcoat layer OC may prevent moisture or air from penetrating into the above-described lower member. The overcoat layer OC may protect the above-described lower member from a foreign substance such as dust.

According to an embodiment, the overcoat layer OC may include an organic material such as an acrylates resin, an epoxy resin, a phenolic resin, a polyamides resin, a polyimides resin, a polyesters resin, a polyphenylenesulfides resin, or benzocyclobutene (BCB). However, the disclosure is not limited to the above-described example.

The upper film layer UFL may be disposed on the color filter layer CFL. The upper film layer UFL may be disposed on an outer side of the display device DD to reduce an external influence. The upper film portion UFL may be provided over the sub-pixels SPX. According to an embodiment, the upper film layer UFL may include one of a polyethyleneterephthalate (PET) film, a low reflective film, a polarization film, and a transmittance controllable film, but is not limited thereto.

Hereinafter, a structure of lines of the display device 100 according to the embodiment is described with reference to FIGS. 12 to 18.

Figure 12:
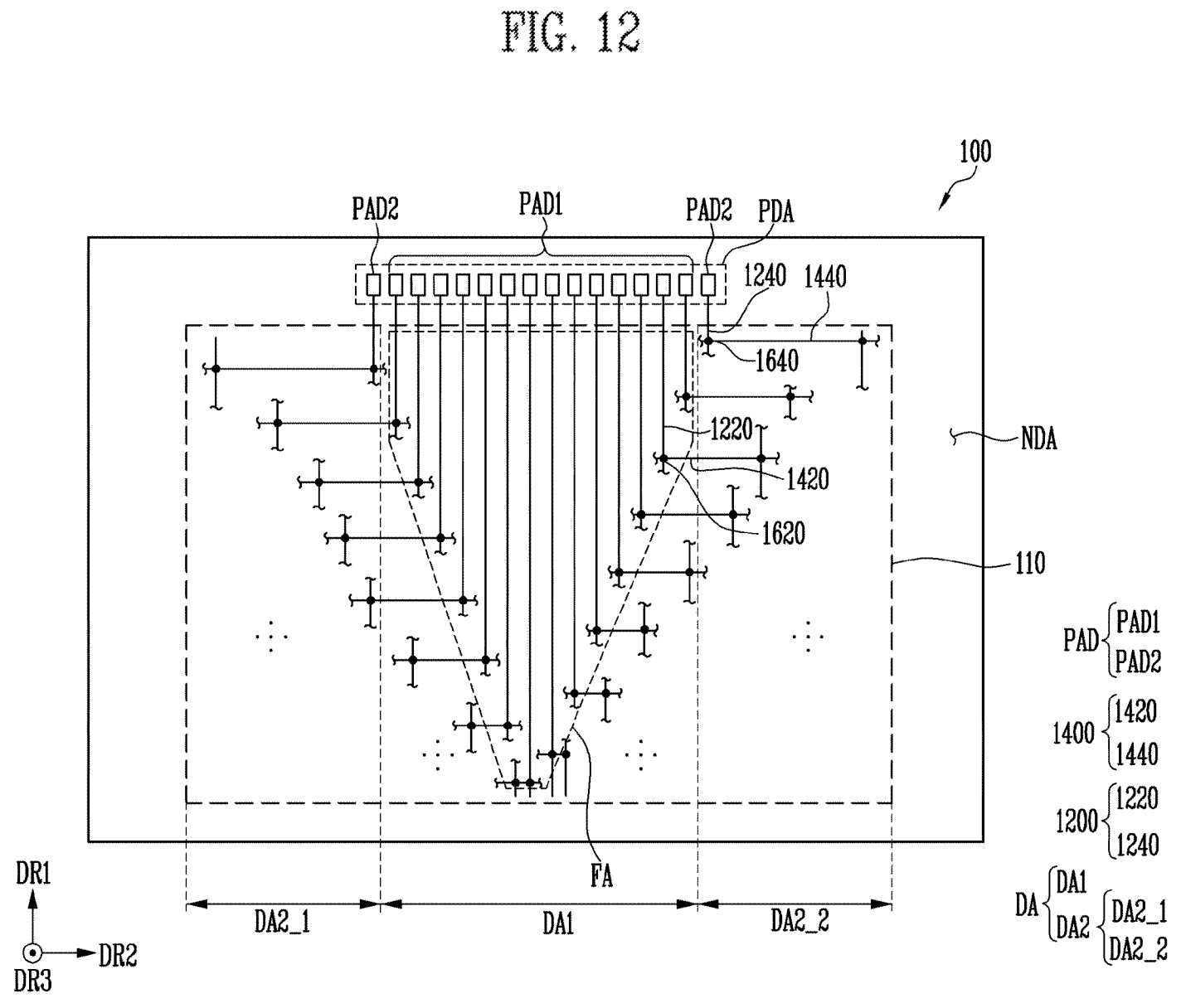
Figure 13:
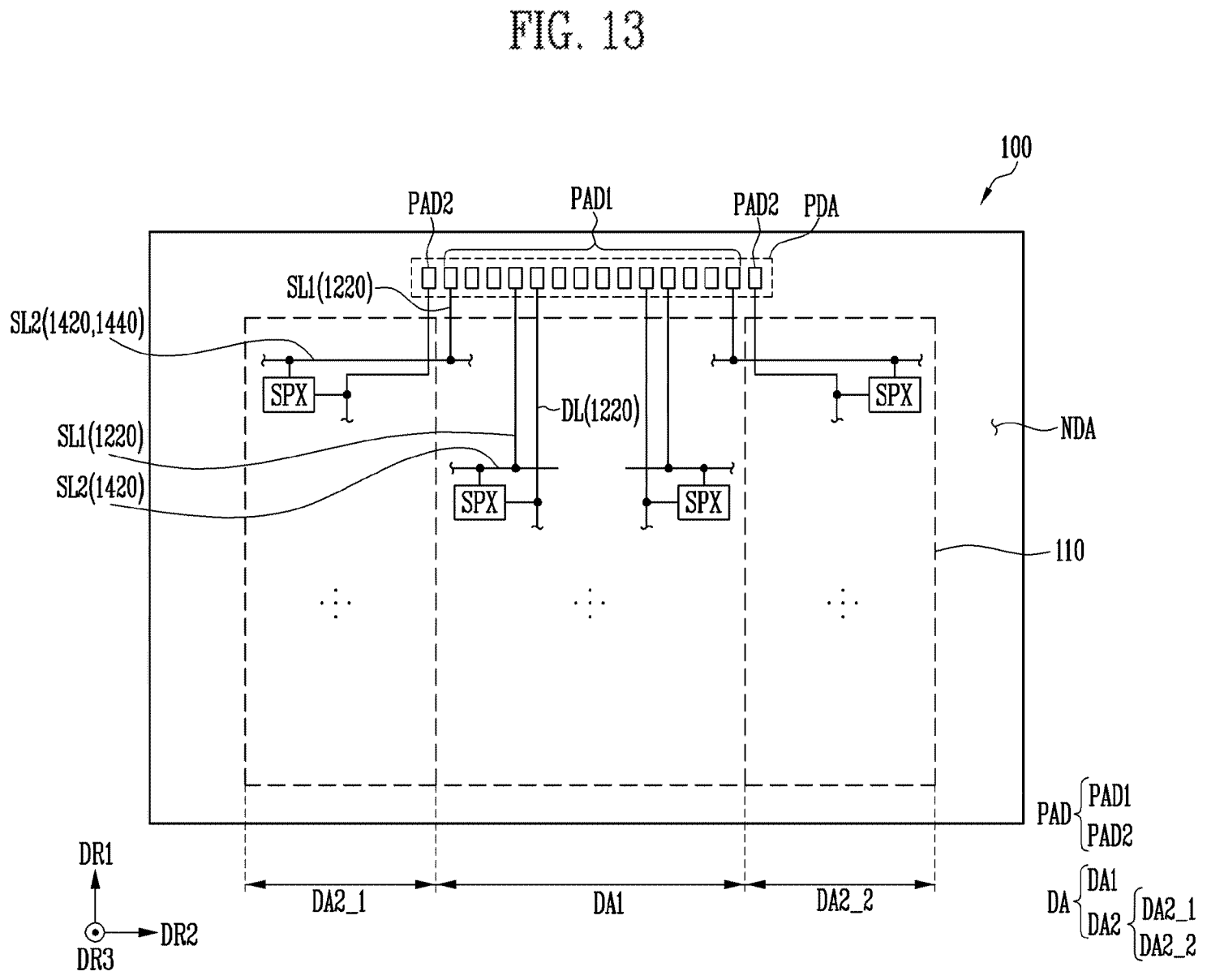
Figure 14:
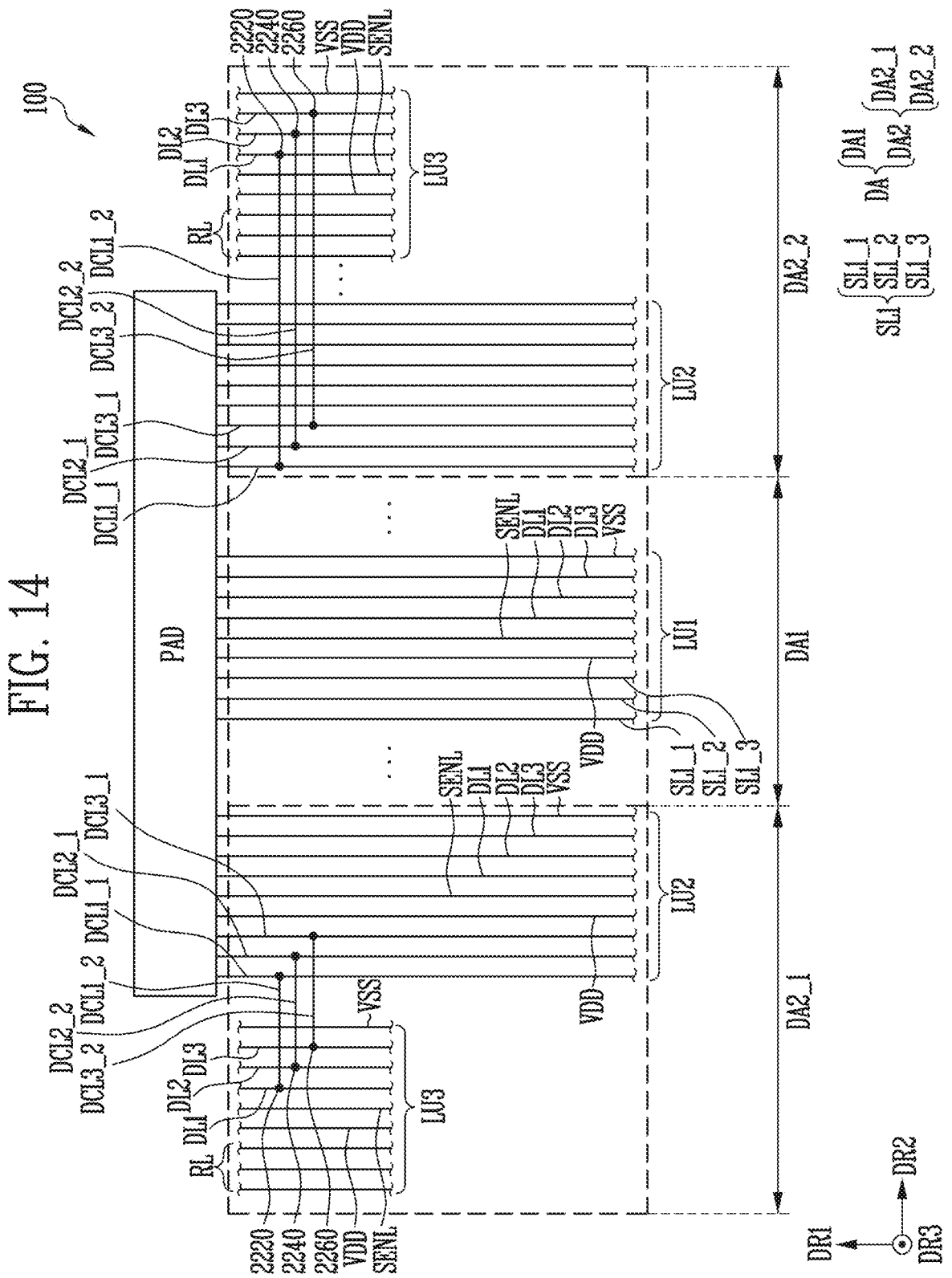

FIGS. 12 to 14 are schematic plan views illustrating a display device according to an embodiment, and are schematic plan views illustrating a pad area and a display area.

FIG. 12 is a schematic diagram illustrating a fan-out area FA, a display area DA, and a pad area PDA based on a first connection line 1200 and a second connection line 1400.

Referring to FIG. 12, the display device 100 may include the display area DA, a non-display area NDA, and the pad area PDA.

The display area DA may be an area in which the pixel part 110 is disposed, and may be an area from which light may be emitted. According to an embodiment, the display area DA may include a long side and a short side. For example, a length of a side of the display area DA may be at least greater than a length of another side. The long side of the display area DA may correspond to the side 112 of the pixel part 110 described above with reference to FIG. 7. According to an embodiment, the scan driver 120 and the data driver 130 described above may be disposed adjacent to the long side of the display area DA as compared to the short side of the display area DA. According to an embodiment, the display area DA may be referred to as an active area.

The non-display area NDA may be an area in which the pixel part 110 is not disposed and may be an area from which no light is emitted. The non-display area NDA may be referred to as a dead space. The non-display area NDA may surround at least a portion of the display area DA. For example, the non-display area NDA may have a shape surrounding a periphery of the display area DA in a plan view. However, the disclosure is not limited thereto, and at least a portion of the non-display area NDA may be disposed inside the display area DA according to an embodiment.

The pad area PDA may be an area in which a pad part PAD is disposed. According to an embodiment, the pad area PDA may be disposed in the non-display area NDA. The pad area PDA may be disposed on the side 112 of the pixel part 110. The pad part PAD may function as a path through which various signals (for example, the scan signal, the data signal, and the like) provided to the sub-pixel SPX are provided. For example, the pad part PAD may be electrically connected to the first connection line 1200 and may be electrically connected to a member (for example, the scan driver 120, the data driver 130, and the controller 140) providing the signals.

According to an embodiment, the display area DA may include a first display area DA1 and a second display area DA2. The second display area DA2 may include a (2_1)-th display area DA2_1 and a (2_2)-th display area DA2_2.

The first display area DA1 may overlap a first pad part PAD1 in the first direction DR1. The first display area DA1 may not overlap a second pad part PAD2 in the first direction DR1.

The second display area DA2 may overlap the second pad part PAD2 in the first direction DR1. The second display area DA2 may not overlap the first pad part PAD1 in the first direction DR1.

Here, the first direction DR1 may refer to a direction substantially the same as a direction in which the first scan line SL1 extends. For example, the first display area DA1 may overlap the first pad part PAD1 in the direction in which the first scan line SL1 extends, and the second display area DA2 may overlap the second pad part PAD2 in the direction in which the first scan line SL1 extends.

The first display area DA1 and the second display area DA2 may be spaced apart from each other in the second direction DR2. For example, the first display area DA1 and the second display area DA2 may be spaced apart from each other in a direction in which the second connection line 1400 extends.

The second display area DA2 may be disposed on a side and/or another side of the first display area DA1. For example, the (2_1)-th display area DA2_1 may be disposed on the side of the first display area DA1, and the (2_2)-th display area DA2_2 may be disposed on the other side of the first display area DA1. The (2_1)-th display area DA2_1 may be disposed adjacent to an end of the long side of the display area DA, and the (2_2)-th display area DA2_2 may be disposed adjacent to another end of the long side of the display area DA.

However, the disclosure is not limited to the above-described example. For example, the second display area DA2 may be configured as a single area rather than being divided into areas. In some embodiments, the second display area DA2 may be disposed on the side of the first display area DA1 (e.g., only the (2_1)-th display area DA2_1 is provided) or the second display area DA2 is disposed on the other side of the first display area DA1 (e.g., only the (2_2)-th display area DA2_2 is provided).

The pad part PAD may include the first pad part PAD1 and the second pad part PAD2. The first pad part PAD1 and the second pad part PAD2 may be spaced apart from each other in the second direction DR2.

The first pad part PAD1 may overlap the first display area DA1 in the first direction DR1. For example, the first display area DA1 may be an area overlapping the first pad part PAD1 in the first direction DR1.

The second pad part PAD2 may overlap the second display area DA2 in the first direction DR1. For example, the second display area DA2 may be an area overlapping the second pad part PAD2 in the first direction DR1.

According to an embodiment, the display device 100 may include lines. The display device 100 may include the first connection line 1200 extending in the first direction DR1 and the second connection line 1400 extending in the second direction DR2.

Each of the above-described scan line SL, data line DL, control line SSL, sensing line SENL, first power line VDD, and second power line VSS may be included in at least a portion of the first connection line 1200 and/or at least a portion of the second connection line 1400. For example, the first connection line 1200 may include the first scan line SL1 and the data line DL, and the second connection line 1400 may include the second scan line SL2.

According to an embodiment, the second scan line SL2 may be disposed in the first display area DA1 or may be disposed over the first display area DA1 and the second display area DA2.

The first connection line 1200 may include a (1_1)-th connection line 1220 and a (1_2)-th connection line 1240. The (1_1)-th connection line 1220 may refer to the first connection line 1200 disposed in the first display area DA1. The (1_2)-th connection line 1240 may refer to the first connection line 1200 disposed in the second display area DA2.

According to an embodiment, the first connection line 1200 may be electrically connected to the pad part PAD. For example, the (1_1)-th connection line 1220 may be electrically connected to the first pad part PAD1, and the (1_2)-th connection line 1240 may be electrically connected to the second pad part PAD2.

The (1_1)-th connection line 1220 may be electrically connected to a (2_1)-th connection line 1420. For example, the (1_1)-th connection line 1220 and the (2_1)-th connection line 1420 may be electrically connected to each other in a first contact part 1620. According to an embodiment, in case that the (1_1)-th connection line 1220 is the first scan line SL1 and the (2_1)-th connection line 1420 is the second scan line SL2, the corresponding first contact part 1620 may be the above-described contact member CP.

The second connection line 1400 may include a (2_1)-th connection line 1420 and a (2_2)-th connection line 1440. The (2_1)-th connection line 1420 may refer to the second connection line 1400 disposed in the first display area DA1. The (2_2)-th connection line 1440 may refer to the second connection line 1400 disposed in the second display area DA2.

The (1_2)-th connection line 1240 may be electrically connected to a portion of the (2_2)-th connection lines 1440. According to an embodiment, a portion of the (2_2)-th connection lines 1440 may be electrically connected to the (1_2)-th connection line 1240 in a second contact part 1640. Another portion of the (2_2)-th connection lines 1440 may not be electrically connected to the (1_2)-th connection line 1240 in the second contact part 1640, and may be electrically connected to the (2_1)-th connection line 1420. The (2_2)-th connection line 1440, the (2_1)-th connection line 1420, and the (1_1)-th connection line 1220 may be electrically connected to each other.

According to an embodiment, each of the (1_1)-th connection lines 1220 may have a length sufficient to connect the corresponding first pad part PAD1 and the (2_1)-th connection line 1420, and may have different lengths. Accordingly, the first contact part 1620 may be disposed in a generally oblique direction with respect to the first direction DR1 and the second direction DR2.

An electrical signal provided through the first pad part PAD1 may be provided to the sub-pixel SPX via the (1_1)-th connection line 1220. For example, the electrical signal provided through the first pad part PAD1 may be provided to the sub-pixel SPX disposed in the first display area DA1 through the (1_1)-th connection line 1220 and the (2_1)-th connection line 1420.

Although the embodiment is not clearly shown, the electrical signal provided through the first pad part PAD1 (for example, the scan signal provided to the sub-pixel SPX disposed in the second display area DA2) may be provided to the sub-pixel SPX disposed in the second display area DA2 through the (1_1)-th connection line 1220, the (2_1)-th connection line 1420, and the (2_2)-th connection line 1440. For example, according to an embodiment, the (2_1)-th connection line 1420 may be connected to the (2_2)-th connection line 1440.

An electrical signal provided through the second pad part PAD2 may be provided to the sub-pixel SPX via the (1_2)-th connection line 1240. For example, the electrical signal provided through the second pad part PAD2 may be provided to the sub-pixel SPX disposed in the second display area DA2 via the (1_2)-th connection line 1240 and the (2_2)-th connection line 1440.

According to an embodiment, the display area DA may include the fan-out area FA. The fan-out area FA may overlap the display area DA in a plan view. The fan-out area FA may overlap the first display area DA1 in a plan view. According to an embodiment, the fan-out area FA may overlap the first pad part PAD1 in the first direction DR1 and may not overlap the second pad part PAD2 in the first direction DR1.

The fan-out area FA may be an area in which a distance (a separation distance or a pitch) between the (2_1)-th connection lines 1420 adjacent to each other in the second direction DR2 is changed. A length of the fan-out area FA in the first direction DR1 may be different. For example, the length of the fan-out area FA in the first direction DR1 may decrease as a distance from the pad area PDA increases. The (1_1)-th connection line 1220 may pass through the fan-out area FA. According to an embodiment, the fan-out area FA may be defined by an area in which the first contact part 1620 is disposed. For example, an outer line of the fan-out area FA may correspond to lines on which the first contact part 1620 is arranged.

According to an embodiment, the fan-out area FA may be disposed to overlap the display area DA. For example, the first connection lines 1200 may extend directly to the display area DA without the need to dispose a separate fan-out area between the pad area PDA and the display area DA. Thus, a size of the non-display area NDA may be reduced. While a size of the non-display area NDA in which an image is not provided may be reduced, the display area DA in which the image is visually recognized may be expanded. Therefore, the display device 100 having a large area may be provided, and an aesthetic sense for the display device 100 of a user may be improved.

As a specific embodiment, line structures of the sub-pixel SPX connected through the first connection line 1200 and the second connection line 1400 are described with reference to FIG. 13.

Referring to FIG. 13, the sub-pixel SPX (for example, a first pixel) disposed in the first display area DA1 may receive the scan signal and the data signal through the first pad parts PAD1.

The electrical signal provided from the first pad part PAD1 may include the scan signal and the data signal to be provided to the sub-pixel SPX disposed in the first display area DA1.

For example, the sub-pixel SPX disposed in the first display area DA1 may receive the scan signal provided from a scan pad part which is any one of the first pad parts PAD1 through the first scan line SL1 (the (1_1)-th connection line 1220) and the second scan line SL2 (the (2_1)-th connection line 1420). The sub-pixel SPX disposed in the first display area DA1 may receive the data signal provided from a data pad part which is any one of the first pad parts PAD1 through the data line DL (the (1_1)-th connection line 1220).

The sub-pixel SPX (for example, a second pixel) disposed in the second display area DA2 may receive the scan signal through the first pad part PAD1, and may receive the data signal through the second pad part PAD2.

The electrical signal provided from the first pad part PAD1 may include the scan signal to be provided to the sub-pixel SPX disposed in the second display area DA2. The electrical signal provided from the second pad part PAD2 may include the data signal to be provided to the sub-pixel SPX disposed in the second display area DA2.

The sub-pixel SPX disposed in the second display area DA2 may receive the scan signal through the scan line SL connected to the first pad part PAD1 and may receive the data signal through the data line DL connected to the second pad part PAD2.

For example, the sub-pixel SPX provided in the second display area DA2 may receive the scan signal provided from the scan pad part which is any one of the first pad parts PAD1 through the first scan line SL1 (the (1_1)-th connection line 1220) and the second scan line SL2 (the (2_1)-th connection line 1420). The sub-pixel SPX disposed in the second display area DA2 may receive the data signal provided from the data pad part which is any one of the second data pads PAD2 through the data line DL (the (1_2)-th connection line 1240 and the (2_2)-th connection line 1440).

Hereinafter, a structure of a line including a characteristic related to division of the first display area DA1 and the second display area DA2 is described in more detail with reference to FIGS. 14 and 15.

FIG. 14 is a schematic plan view of a display device based on a line part according to an embodiment. FIG. 15 is a schematic plan view of a display device illustrating a connection structure of scan lines according to an embodiment.

The first display area DA1 may refer to an area in which a first line part LU1 including the first scan line SL1 is disposed as an area in which the first scan line SL1 is disposed. The first pad part PAD1 may refer to a pad configuration that overlaps the first line part LU1 in the first direction DR1.

The second display area DA2 may refer to an area in which the first scan line SL1 is not disposed. The second display area DA2 may refer to an area in which a second line part LU2 and/or a third line part LU3 which does not include the first scan line SL1 is disposed. The second pad part PAD2 may refer to a pad component that overlaps the second line part LU2 or the third line part LU3 in the first direction DR1.

According to an embodiment, the display device 100 may include the first line part LU1, the second line part LU2, and the third line part LU3. According to an embodiment, the first line part LU1, the second line part LU2, and the third line part LU3 may be line patterns repeatedly arranged and may be a bundle of the first connection lines 1200 extending in the first direction DR1. For example, although not further shown in the drawing, first line parts LU1 may be repeatedly disposed in the first display area DA1. For example, in case that a process for forming the lines is performed, the lines may be repeatedly patterned identically. The lines (for example, the first line part LU1, the second line part LU2, and the third line part LU3) may be provided by electrically connecting and disconnecting some lines.

The first line part LU1 may be disposed in the first display area DA1. The first line part LU1 may be a line part (or a line bundle) including the first scan line SL1.

The first line part LU1 may include the first scan line SL1, the first power line VDD, the second power line VSS, first to third data lines DL1, DL2, and DL3, and sensing line SENL. A disposition order of each of the lines of FIG. 14 is an example and is not limited thereto.

At least a portion of each of the first scan line SL1, the first power line VDD, the second power line VSS, the first to third data lines DL1, DL2, and DL3, and the sensing line SENL of the first line part LU1 may be included in the (1_1)-th connection line 1220.

According to an embodiment, the first scan line SL1 may include a (1_1)-th scan line SL1_1, a (1_2)-th scan line SL1_2, and a (1_3)-th scan line SL1_3. For example, first scan lines SL1 may be included in a line bundle.

Figure 15:
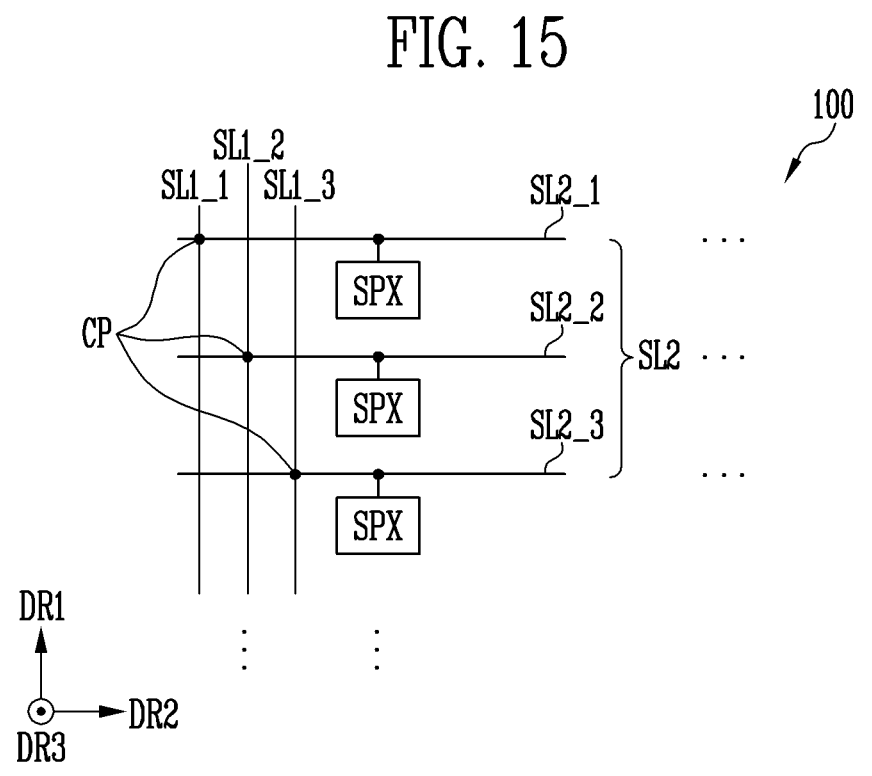

Referring to FIG. 15, the (1_1)-th scan line SL1_1, the (1_2)-th scan line SL1_2, and the (1_3)-th scan line SL1_3 may extend in the first direction DR1. The (1_1)-th scan line SL1_1, the (1_2)-th scan line SL1_2, and the (1_3)-th scan line SL1_3 may be vertical lines to be respectively connected to the sub-pixels SPX arranged in the first direction DR1. Finally, the first line part LU1 may include the first scan lines SL1 connected to the sub-pixel SPX of each of pixel rows (for example, three pixel rows) arranged in the first direction DR1.

For example, the (1_1)-th scan line SL1_1 may be electrically connected to one of the sub-pixels SPX through a (2_1)-th scan line SL2_1, which is one of the second scan lines SL2, and the contact member CP. The (1_2)-th scan line SL1_2 may be electrically connected to one of the sub-pixels SPX through a (2_2)-th scan line SL2_2, which is one of the second scan lines SL2, and the contact member CP. The (1_3)-th scan line SL1_3 may be electrically connected to one of the sub-pixels SPX through a (2_3)-th scan line SL2_3, which is one of the second scan lines SL2, and the contact member CP.

Here, the (2_1)-th scan line SL2_1 may be disposed on a side of the sub-pixel SPX disposed in a first pixel row. The (2_2)-th scan line SL2_2 may be disposed on a side of the sub-pixel SPX disposed in a second pixel row. The (2_3)-th scan line SL2_3 may be disposed on a side of the sub-pixel SPX disposed in a third pixel row.

The first to third data lines DL1, DL2, and DL3 of the first line part LU1 may be electrically connected to the sub-pixels SPX disposed in a pixel column, respectively. The first power line VDD, the second power line VSS, and the sensing line SENL of the first line part LU1 may be electrically connected to any one of the sub-pixels SPX.

The second line part LU2 may be disposed in the second display area DA2. The second line part LU2 may be a line part (or a bundle) that does not include the first scan line SL1. The second line part LU2 may overlap the pad part PAD in the first direction DR1. The second line part LU2 may be disposed between the first line part LU1 and the third line part LU3.

Similar to the first line part LU1, the second line part LU2 may include the first power line VDD, the second power line VSS, the first to third data lines DL1, DL2, and DL3, and the sensing line SENL. However, the second line part LU2 may not include the first scan line SL1, and may include a (1_1)-th data connection line DCL1_1, a (2_1)-th data connection line DCL2_1, and a (3_1)-th data connection line DCL3_1. The (1_1)-th data connection line DCL1_1, the (2_1)-th data connection line DCL2_1, and the (3_1)-th data connection line DCL3_1 may be referred to as a first extension data connection line.

In order to implement the single side driving structure as described above, the scan line SL may include the first scan line SL1 extending in the first direction DR1 (for example, a vertical direction) and the second scan line SL2 extending in the second direction DR2 (for example, a horizontal direction). Two or more sub-pixels SPX disposed in a same pixel row may be connected to the second scan line SL2 electrically connected to any one of the first scan lines SL1. Accordingly, the first scan line SL1 may not be entirely arranged in the display area DA, and may be locally arranged in an area thereof. For example, according to an embodiment, the first scan line SL1 may be disposed in the first display area DA1 which is an area of the display area DA, and may not be disposed in the second display area DA2. The first scan line SL1 disposed in the first display area DA1 may be connected to each of the sub-pixels SPX disposed spaced apart in the second direction DR2 through the second scan line SL2.

Accordingly, even in case that the second line part LU2 does not include the first scan line SL1, the sub-pixel SPX connected to the second line part LU2 may receive the scan signal through the second scan line SL2 electrically connected to the scan line SL1 of the first line part LU1.

The second line part LU2 may overlap the pad part PAD in the first direction DR1. Accordingly, lines may extend directly from the data pad part of the pad part PAD, and the first to third data lines DL1, DL2, and DL3 may be provided.

According to an embodiment, the first line part LU1 and the second line part LU2 may be lines in which a same bundle is repeatedly patterned. Since the first scan line SL1 is not required to be provided to the second line part LU2, an extra line may be provided. Lines corresponding to the first scan line SL1 of the first line part LU1 may be provided as data connection lines DCL1_1, DCL2_1, and DCL3_1 in the second line part LU2. For example, in the repeated pattern, a (1_1)-th data connection line DCL1_1 may correspond to the (1_1)-th scan line SL1_1 of the first line part LU1. A (2_1)-th data connection line DCL2_1 may correspond to the (1_2)-th scan line SL1_2 of the first line part LU1. A (3_1)-th data connection line DCL3_1 may correspond to the (1_3)-th scan line SL1_3 of the first line part LU1.

The third line part LU3 may be disposed in the second display area DA2. The third line part LU3 may be a line part (or a bundle) that does not include the first scan line SL1. The third line part LU3 may not overlap the pad part PAD in the first direction DR1. The second line part LU2 may be adjacent to the third line part LU3 compared to the first line part LU1.

Similar to the first line part LU1, the third line part LU3 may include the first power line VDD, the second power line VSS, the first to third data lines DL1, DL2, and DL3, and the sensing line SENL. However, the third line part LU3 may not include the first scan line SL1 and may include a residual line RL. The residual line RL may correspond to the first scan line SL1 of the first line part LU1 and the data connection lines DCL1_1, DCL2_1, and DCL3_1 of the second line part LU2 in the repeated pattern. According to an embodiment, the residual line RL may be provided as a ground line. According to an embodiment, the sub-pixel SPX for the third line part LU3 may be referred to as an outer pixel.

The third line part LU3 may not overlap the pad part PAD in the first direction DR1. Accordingly, it may be difficult to provide the data line DL from the pad part PAD to the third line part LU3 as it is. However, according to an embodiment, the first data line DL1 of the third line part LU3 may receive the data signal from the pad part PAD through the (1_1)-th data connection line DCL1_1 and a (1_2)-th data connection line DCL1_2 of the second line part LU2. The (1_2)-th data connection line DCL1_2 and the first data line DL1 of the third line part LU3 may be electrically connected to each other at a first contact position 2220.

Here, the (1_2)-th data connection line DCL1_2 may connect lines of the second line part LU2 and the third line part LU3 in the second direction DR2. The (1_2)-th data connection line DCL1_2 may be included in the second connection line 1400.

For example, the (1_1)-th data connection line DCL1_1 of the second line part LU2 may provide the data signal to be provided to the first data line DL1 of the third line part LU3.

The (1_2)-th data connection line DCL1_2, a (2_2)-th data connection line DCL2_2, and a (3_2)-th data connection line DCL3_2 may be referred to as a second extension data connection line.

According to an embodiment, the second data line DL2 of the third line part LU3 may receive the data signal from the pad part PAD through the (2_1)-th data connection line DCL2_1 and the (2_2)-th data connection line DCL2_2 of the second line part LU2. The (2_2)-th data connection line DCL2_2 and the second data line DL2 of the third line part LU3 may be electrically connected to each other at a second contact position 2240. Here, the (2_2)-th data connection line DCL2_2 may connect the lines of the second line part LU2 and the third line part LU3 in the second direction DR2. The (2_2)-th data connection line DCL2_2 may be included in the second connection line 1400.

For example, the (2_1)-th data connection line DCL2_1 of the second line part LU2 may provide the data signal to be provided to the second data line DL2 of the third line part LU3.

According to an embodiment, the third data line DL3 of the third line part LU3 may receive the data signal from the pad part PAD through the (3_1)-th data connection line DCL3_1 and the (3_2)-th data connection line DCL3_2 of the second line part LU2. The (3_2)-th data connection line DCL3_2 and the third data line DL3 of the third line part LU3 may be electrically connected to each other at a third contact position 2260. Here, the (3_2)-th data connection line DCL3_2 may connect the lines of the second line part LU2 and the third line part LU3 in the second direction DR2. The (3_2)-th data connection line DCL3_2 may be included in the second connection line 1400.

For example, the (3_1)-th data connection line DCL3_1 of the second line part LU2 may provide the data signal to be provided to the third data line DL3 of the third line part LU3.

According to an embodiment, the first contact position 2220, the second contact position 2240, and the third contact position 2260 may be disposed along a first line. Here, a direction in which the first line extends may be different from (or may not be parallel to) the first direction DR1 and the second direction DR2. The direction in which the first line extends may be formed so as not to be parallel to a direction in which each side of the display area DA extends.

According to an embodiment, the display device 100 having a large area may be provided while implementing the single side driving structure. As described above, in order to provide the display device 100 having the display area DA having a large area, an area that does not overlap the pad part PAD for providing an electrical signal in a direction (for example, the first direction DR1) may occur. Experimentally, since lines are closely disposed to implement the single side driving structure, it may be difficult to provide a driving signal (for example, the data signal) to a specific area.

However, due to a structure of the first and second scan lines SL1 and SL2 included in the second line part LU2 overlapping the pad part PAD in a direction, additional lines may be secured. Such additionally secured lines may be used to connect to the data lines DL1, DL2, and DL3 included in the third line part LU3 that do not overlap the pad part PAD in a direction, and thus a structure capable of appropriately providing the data signal in the single side driving structure may be implemented.

The need to secure an area of the pad part PAD may be resolved, and ultimately, the number of individual pads of the pad part PAD may be reduced. Here, an effect of improving a process in which a process margin is secured by increasing a separation distance between individual pads may be derived, and structural freedom (e.g., the degree of structural variation) may be improved by selectively reducing the area of the pad part PAD.

Figure 16:
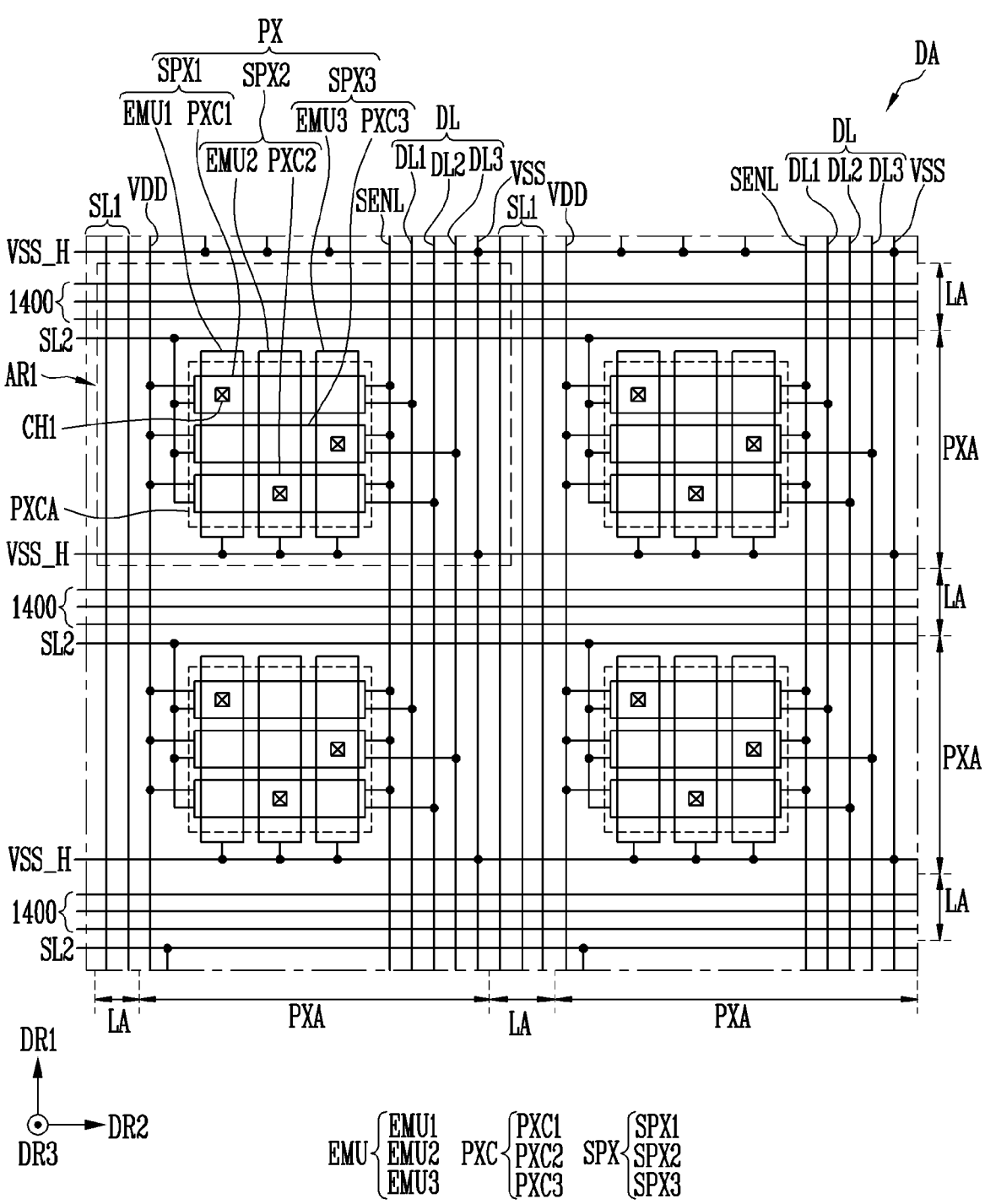
FIGS. 16 to 18 are schematic plan views illustrating a display device based on a display area according to an embodiment.
Figure 17:
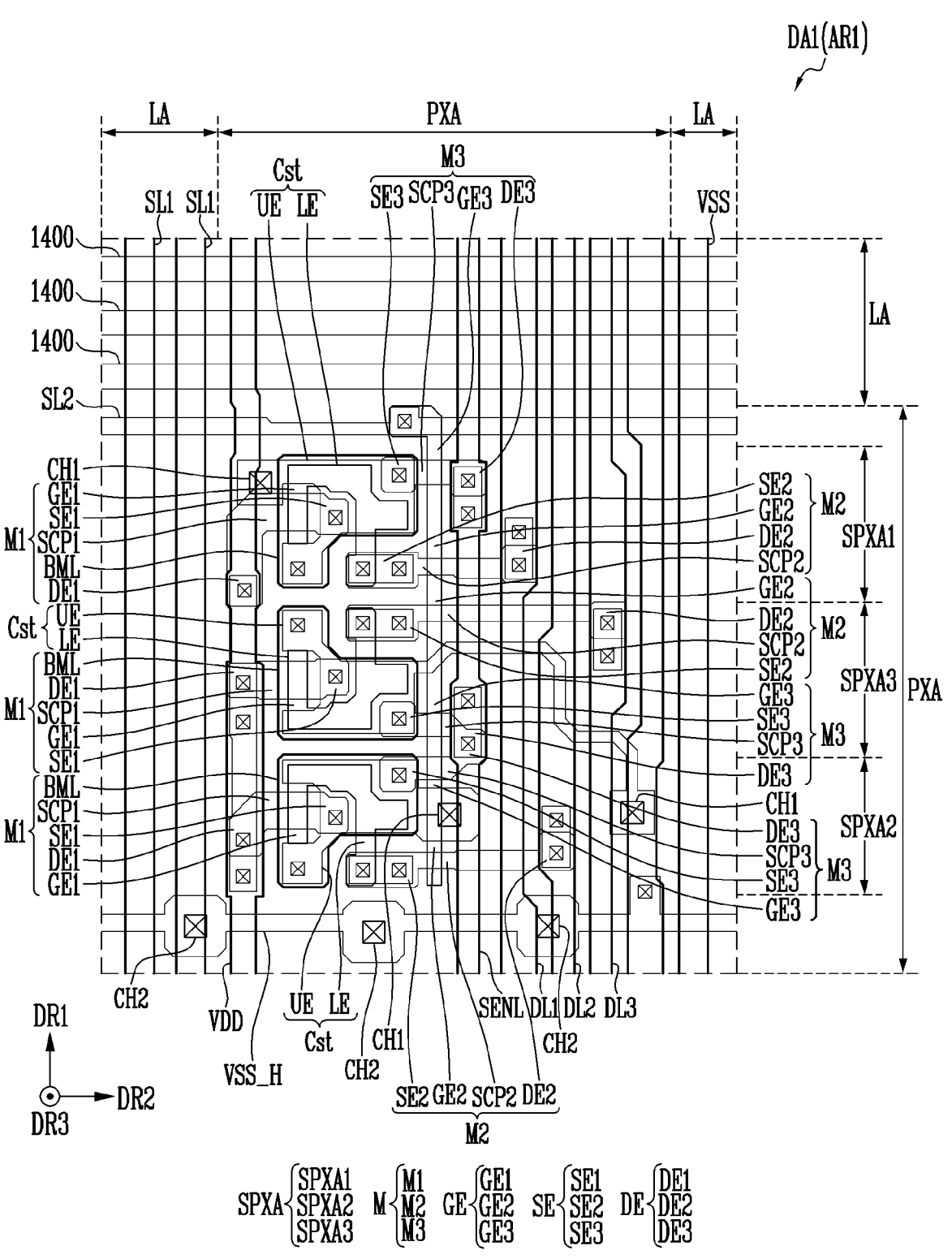
Figure 18:
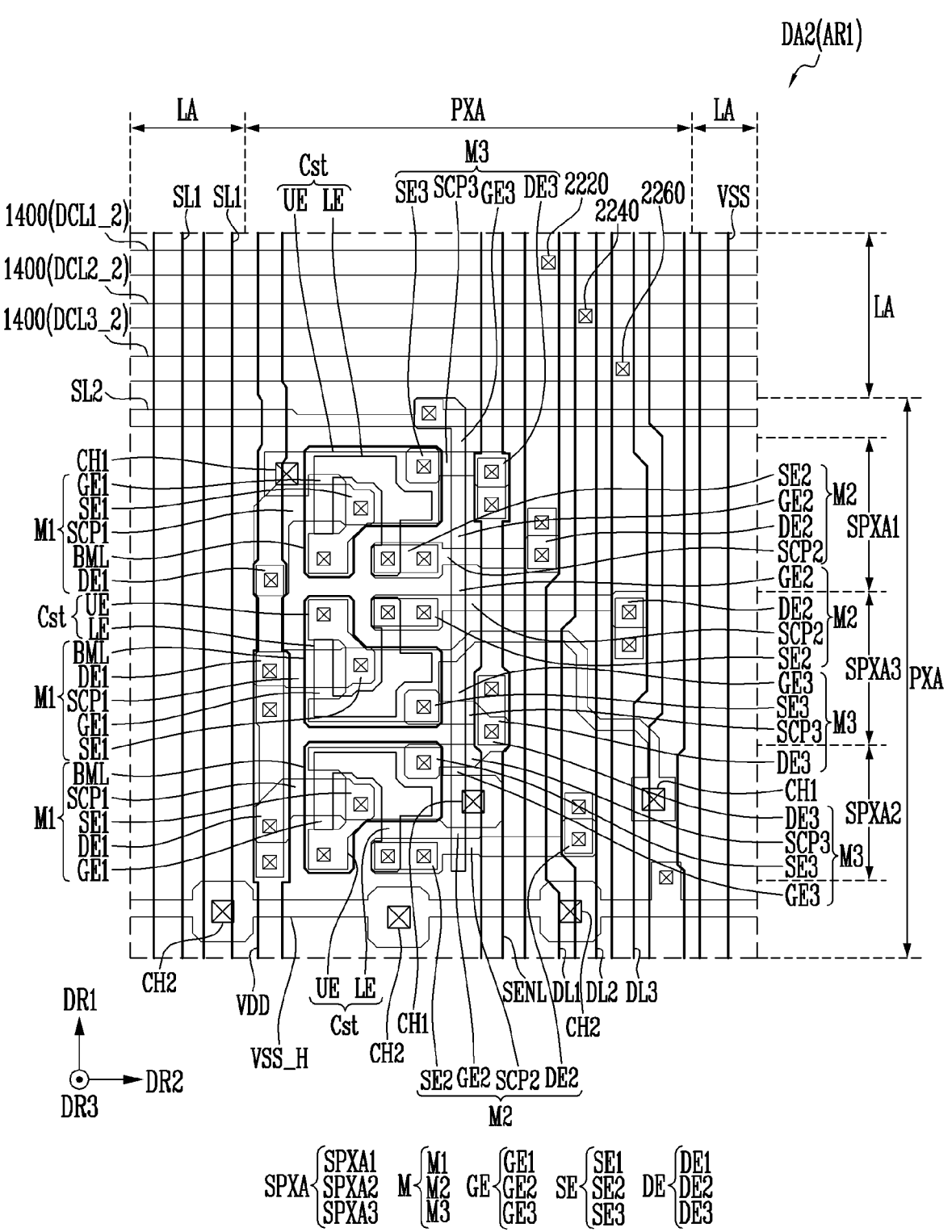

FIGS. 16 to 18 are schematic plan views illustrating a display device based on a display area according to an embodiment. FIGS. 17 and 18 illustrates one of the pixels PX shown in FIG. 16, in more detail. FIG. 17 may be a schematic diagram of an equivalent circuit illustrating the pixel PX disposed in the first display area DA1, and FIG. 18 may be a schematic diagram of an equivalent circuit illustrating the pixel PX disposed in the second display area DA2.

FIG. 16 illustrates the display area DA based on four pixel areas PXA in which four pixels PX are disposed and a portion of a line area LA disposed around the pixel areas PXA. The pixel area PXA may be defined to include the scan line SL, the data lines DL, the sensing line SENL, the first power line VDD, and the second power line VSS corresponding thereto. FIG. 15 illustrates the first scan line SL1, the second scan line SL2, the first power line VDD, the second power line VSS, and the sensing line SENL corresponding to the pixel area PXA.

The display area DA may include the pixel areas PXA and the line area LA.

The pixel area PXA may be an area including the sub-pixels SPX, the pixel circuits PXC for the sub-pixels SPX, and the light emitting parts EMU. The pixel area PXA may be an area further selectively including a portion of lines connected to the sub-pixels SPX.

The pixel PX may include sub-pixels SPX. For example, the pixel PX may include the first sub-pixel SPX1, the second sub-pixel SPX2, and the third sub-pixel SPX3.

The pixel PX may be connected to the first to third data lines DL1, DL2, and DL3. For example, the first sub-pixel SPX1 may be electrically connected to the first data line DL1, the second sub-pixel SPX2 may be electrically connected to the second data line DL2, and the third sub-pixel SPX3 may be electrically connected to the third data line DL3. As described above, the first to third data lines DL1, DL2, and DL3 may extend in the first direction DR1.

The pixel PX may be connected to the first scan line SL1 and the second scan line SL2. For example, each of the first to third sub-pixels SPX1, SPX2, and SPX3 may be electrically connected to the first scan line SL1 extending in the first direction DR1 and the second scan line SL2 extending in the second direction DR2.

The pixel PX may be electrically connected to the sensing line SENL extending in the first direction DR1. For example, a sensing line SENL may be disposed for each pixel column, and the sensing line SENL may be commonly connected to each pixel PX disposed in a same pixel column.

The pixel PX may be electrically connected to the first power line VDD. For example, the pixel PX may be electrically connected to the first power line VDD extending in the first direction DR1.

The pixel PX may be electrically connected to the second power line VSS. For example, the pixel PX may be electrically connected to the second power line VSS and may be electrically connected to the second power line VSS extending in the first direction DR1 through a horizontal power line VSS_H extending in the second direction DR2.

The sub-pixels SPX may include the pixel circuit PXC and the light emitting part EMU. For example, the first sub-pixel SPX1 may include a first pixel circuit PXC1 and a first light emitting part EMU1, the second sub-pixel SPX2 may include a second pixel circuit PXC2 and a second light emitting part EMU2, and the third sub-pixel SPX3 may include a third pixel circuit PXC3 and a third light emitting part EMU3.

The first to third pixel circuits PXC1, PXC2, and PXC3 may be disposed in a pixel circuit area PXCA of the pixel area PXA and may be arranged in the first direction DR1. In an embodiment, the third pixel circuit PXC3 may be positioned at a center of the pixel circuit area PXCA in the first direction DR1, and the first and second pixel circuits PXC1 and PXC2 may be disposed on sides (or both sides) of the third pixel circuit PXC3 in the first direction DR1. However, the positions and/or arrangement order of the first, second, and third pixel circuits PXC1, PXC2, and PXC3 may be changed according to an embodiment.

The first, second, and third pixel circuits PXC1, PXC2, and PXC3 may be connected to the first, second, and third light emitting parts EMU1, EMU2, and EMU3 through respective first contact holes CH1, respectively.

The first, second, and third light emitting parts EMU1, EMU2, and EMU3 may be electrically connected to the respective pixel circuits PXC.

The first, second, and third light emitting parts EMU1, EMU2, and EMU3 may be arranged in the second direction DR2 in each pixel area PXA. In an embodiment, the first, second, and third light emitting parts EMU1, EMU2, and EMU3 may be sequentially arranged in the second direction DR2.

Although FIG. 16 illustrates an embodiment in which the pixel circuits PXC and the light emitting parts EMU of the sub-pixels SPX are arranged in different directions, the disclosure is not limited thereto.

The line area LA may not overlap the pixel area PXA in a plan view. For example, the line area LA may not overlap the pixel circuits PXC and the light emitting parts EMU. However, the disclosure is not limited to the above-described example.

Lines extending in the first direction DR1 or the second direction DR2 may be disposed in the line area LA. For example, lines corresponding to the first connection line 1200 may be disposed in the line area LA. As another example, lines corresponding to the second connection line 1400 may be disposed in the line area LA. According to an embodiment, the line area LA extending in the first direction DR1 and the line area LA extending in the second direction DR2 may overlap each other. In the area where the line area LA extending in the first direction DR1 and the line area LA extending in the second direction DR2 overlap each other, a contact area between the lines may be formed, and thus the lines may be electrically connected to each other.

A structure of lines of a display area DA according to an embodiment is described in more detail with reference to FIGS. 17 and 18.

FIG. 17 is a schematic plan view illustrating an area corresponding to a first area AR1 of FIG. 16 as a schematic plan view illustrating the first display area DA1.

FIG. 18 is a schematic plan view illustrating an area corresponding to the first area AR1 of FIG. 16 as a schematic plan view illustrating the second display area DA2.

First, FIG. 17 illustrates that the pixel circuits PXC, the first scan line SL1, the second scan line SL2, the first to third data lines DL1, DL2, and DL3, the first power line VDD, the second power line VSS, and the horizontal power line VSS_H are disposed in the first display area DA1, and the second connection lines 1400 extend in the second direction DR2.

According to an embodiment, the first pixel circuit PXC1, the second pixel circuit PXC2, and the third pixel circuit PXC3 may be disposed in circuit areas SPXA, e.g., a first circuit area SPXA1, a second circuit area SPXA2, and a third circuit area SPXA3, respectively. The first pixel circuit PXC1, the second pixel circuit PXC2, and the third pixel circuit PXC3 may include transistors M (e.g., the first transistor M1, the second transistor M2, the third transistor M3), and the capacitor Cst disposed in each of the first circuit area SPXA1, the second circuit area SPXA2, and the third circuit area SPXA3. The transistors M may include drain electrodes DE, and source electrodes SE.

Each of the first transistors M1 may include a first semiconductor pattern SCP1, a first gate electrode GE1, a first source electrode SE1, and a first drain electrode DE1. Each of the first transistors M1 may further include the bottom metal layer BML overlapping the first gate electrode GE1. The first semiconductor pattern SCP1 may overlap the first gate electrode GE1 and may be connected to the first source electrode SE1 and the first drain electrode DE1. The first gate electrode GE1 may be connected to a lower electrode LE of the capacitor Cst and the second source electrode SE2. The first source electrode SE1 may be connected to an upper electrode UE of the capacitor Cst and the third source electrode SE3. The first source electrode SE1 may be connected to the first electrode ELT1 of the light emitting part EMU through the first contact hole CH1. The first drain electrode DE1 may be connected to the first power line VDD. The bottom metal layer BML may be connected to the first source electrode SE1.

The second transistor M2 may include a second semiconductor pattern SCP2, a second gate electrode GE2, a second source electrode SE2, and a second drain electrode DE2. The second semiconductor pattern SCP2 may overlap the second gate electrode GE2 and may be connected to the second source electrode SE2 and the second drain electrode DE2. The second gate electrode GE2 may be connected to the second scan line SL2. The second source electrode SE2 may be connected to the lower electrode LE of the capacitor Cst and the first gate electrode GE1. The second drain electrode DE2 may be connected to any one of the data lines DL1, DL2, and DL3. For example, the second drain electrode DE2 of the first pixel circuit PXC1, the second drain electrode DE2 of the second pixel circuit PXC2, and the second drain electrode DE2 of the third pixel circuit PXC3 may be connected to the first data line DL1, the second data line DL2, and the third data line DL3, respectively.

The third transistor M3 may include a third semiconductor pattern SCP3, a third gate electrode GE3, a third source electrode SE3, and a third drain electrode DE3. The third semiconductor pattern SCP3 may overlap the third gate electrode GE3 and may be connected to the third source electrode SE3 and the third drain electrode DE3. The third gate electrode GE3 may be connected to the second scan line SL2. Although not shown in the drawings, in an embodiment, the third gate electrode GE3 may be connected to a separate control line SSL separated from the second scan line SL2. The third source electrode SE3 may be connected to the upper electrode UE of the capacitor Cst and the first source electrode SE1. The third drain electrode DE3 may be connected to the sensing line SENL.

The capacitor Cst may include the lower electrode LE and the upper electrode UE. The lower electrode LE may be connected to the first gate electrode GE1 and the second source electrode SE2. The upper electrode UE may be connected to the first source electrode SE1 and the third source electrode SE3.

According to an embodiment, the bottom metal layer BML, the sensing line SENL, the first to third data lines DL1, DL2, and DL3, the first power line VDD, and the second power line VSS provided in the display area DA may be disposed on a same layer (for example, a first conductive layer).

According to an embodiment, the semiconductor patterns SCP provided in the display area DA may be disposed on a same layer.

According to an embodiment, the gate electrodes GE and the lower electrodes LE of the capacitors Cst provided in the display area DA may be disposed on a same layer (for example, a second conductive layer).

According to an embodiment, the source electrodes SE, the drain electrodes DE, the upper electrodes UE of the capacitors Cst, the second scan line SL2, and the horizontal power line VSS_H, and the second connection lines 1400 provided in the display area DA may be disposed on a same layer (for example, a third conductive layer).

An area corresponding to the first area AR1 of the second display area DA2 is described with reference to FIG. 18. Contents that may overlap the contents described above are simplified or omitted, and a point different from the above-described technical feature is described with reference to FIG. 17.

Referring to FIG. 18, the second connection lines 1400 may be adjacent to a side of the pixel area PXA and may extend in the second direction DR2. The second connection lines 1400 may be electrically connected to each of the first to third data lines DL1, DL2, and DL3.

Referring to FIGS. 14 and 18, one of the second connection lines 1400 may be the (1_2)-th data connection line DCL1_2. The (1_2)-th data connection line DCL1_2 may be electrically connected to the first data line DL1 at the first contact position 2220. Accordingly, the data signal may be provided to the first data line DL1 provided in the second display area DA2 via the (1_1)-th data connection line DCL1_1 and the (1_2)-th data connection line DCL1_2 of the second line part LU2.

Another one of the second connection lines 1400 may be the (2_2)-th data connection line DCL2_2. The (2_2)-th data connection line DCL2_2 may be electrically connected to the second data line DL2 at the second contact position 2240. Accordingly, the data signal may be provided to the second data line DL2 provided in the second display area DA2 via the (2_1)-th data connection line DCL2_1 and the (2_2)-th data connection line DCL2_2 of the second line part LU2.

Still another one of the second connection lines 1400 may be the (3_2)-th data connection line DCL3_2. The (3_2)-th data connection line DCL3_2 may be electrically connected to the third data line DL3 at the third contact position 2260. Accordingly, the data signal may be provided to the third data line DL3 provided in the second display area DA2 via the (3_1)-th data connection line DCL3_1 and the (3_2)-th data connection line DCL3_2 of the second line part LU2.

However, the disclosure is not limited to the above-described example, and the above-described electrodes may be provided in various structures. For example, the capacitors Cst may be adjacent to each other in the second direction DR2.

Finally, the data signal may be provided to the data lines DL1, DL2, and DL3 disposed in the second display area DA2 through the second connection line 1400 formed adjacent to the pixel area PXA. For example, according to an embodiment, a single side driving structure in which the data signal is efficiently provided to the outer area without a request for an excessive expansion of the pad area PDA may be formed.

The above description is merely an example of the technical features of the disclosure, and those skilled in the art to which the disclosure pertains will be able to make various modifications and variations without departing from the essential characteristics of the disclosure. Therefore, the embodiments of the disclosure described above may be implemented separately or in combination with each other.

Therefore, the embodiments disclosed in the disclosure are not intended to limit the technical features of the disclosure, but to describe the technical features of the disclosure, and the scope of the technical features of the disclosure is not limited by these embodiments. The protection scope of the disclosure should be interpreted by the following claims, and it should be interpreted that all technical features within the equivalent scope are included in the scope of the disclosure.

What is claimed is:

1. A display device including:
a display area;
a pad area;
a pixel part disposed in the display area and including a pixel;
a pad part disposed in the pad area and including:
at least one first pad part; and
at least one second pad part; and
a connection line including:
a first connection line extending in a first direction; and
a second connection line extending in a second direction different from the first direction, wherein
the display area includes:
a first display area overlapping the at least one first pad part in the first direction; and
a second display area at least partially overlapping the at least one second pad part in the first direction;
the first connection line includes a first extension data connection line overlapping the at least one second pad part in the first direction,
the second connection line includes a second extension data connection line electrically connected to the first extension data connection line, and
the at least one second pad part is electrically connected to the pixel in the second display area through the first extension data connection line and the second extension data connection line.

2. The display device according to claim 1, further comprising:
a scan driver that provides a scan signal for the pixel; and
a data driver that provides a data signal for the pixel,
wherein the scan driver and the data driver are disposed on a same side of the pixel part.

3. The display device according to claim 2, wherein
the display area includes a short side and a long side, and
the scan driver and the data driver are disposed closer to the long side than the short side.

4. The display device according to claim 2, wherein
the first connection line includes a first scan line electrically connected to the at least one first pad part without being connected to the at least one second pad part,
the second connection line includes a second scan line electrically connected to the first scan line, and
the pixel is electrically connected to the at least one first pad part through the first scan line and the second scan line.

5. The display device according to claim 4, wherein
the first scan line is disposed in the first display area without being disposed in the second display area, and
the second scan line is disposed in the first display area or disposed over the first display area and the second display area.

6. The display device according to claim 4, further comprising:
line parts each including a portion of the first connection lines and provided in a pattern repeatedly arranged multiple times, wherein
the line parts include:
a first line part disposed in the first display area;
a second line part disposed in the second display area; and
a third line part,
the first line part includes the first scan line, the second line part and the third line part do not include the first scan line,
the second line part includes the first extension data connection line, and
the third line part does not include the first extension data connection line.

7. The display device according to claim 6, wherein the pixel disposed in the second display area receives a scan signal through the first scan line included in the first line part.

8. The display device according to claim 6, wherein
each of the first line part, the second line part, and the third line part includes data lines, and
the first extension data connection line of the second line part is electrically connected to the data lines of the third line part through the second extension data connection line disposed in the second display area.

9. The display device according to claim 6, wherein at least part of connection lines of the second line part transmits a data signal provided to the third line part.

10. The display device according to claim 6, wherein
the first extension data connection line of the second line part includes:
a $(1\_1)$-th data connection line;
a $(2\_1)$-th data connection line; and
a $(3\_1)$-th data connection line,
the second extension data connection line includes:
a $(1\_2)$-th data connection line;
a $(2\_2)$-th data connection line; and
a $(3\_2)$-th data connection line,
the third line part include:
a first data line;
a second data line; and
a third data line,
the $(1\_2)$-th data connection line electrically connects the $(1\_1)$-th data connection line and the first data line of the third line part,
the $(2\_2)$-th data connection line electrically connects the $(2\_1)$-th data connection line and the second data line of the third line part, and
the $(3\_2)$-th data connection line electrically connects the $(3\_1)$-th data connection line and the third data line of the third line part.

11. The display device according to claim 10, wherein
the first scan line of the first line part includes:
a $(1\_1)$-th scan line;
a $(1\_2)$-th scan line; and
a $(1\_3)$-th scan line, and
the $(1\_1)$-th scan line, the $(1\_2)$-th scan line, and the $(1\_3)$-th scan line correspond to the $(1\_1)$-th data connection line, the $(1\_2)$-th data connection line, and the $(1\_3)$-th data connection line of the second line part in a repeated pattern.

12. The display device according to claim 11, wherein
the second scan line includes:
a $(2\_1)$-th scan line disposed at a side of a first pixel row;
a $(2\_2)$-th scan line disposed at a side of a second pixel row; and
a $(2\_3)$-th scan line disposed at a side of a third pixel row,
the first pixel row, the second pixel row, and the third pixel row are pixel rows adjacent to each other,
the $(1\_1)$-th scan line is electrically connected to one of the pixels disposed in the first pixel row through the $(2\_1)$-th scan line, the (1_2)-th scan line is electrically connected to one of the pixels disposed in the second pixel row through the (2_2)-th scan line, and the (1_3)-th scan line is electrically connected to one of the pixels disposed in the third pixel row through the (2_3)-th scan line.

13. The display device according to claim 10, wherein the third line part further includes a residual line, and the residual line corresponds to the (1_1)-th data connection line, the (1_2)-th data connection line, and the (1_3)-th data connection line of the second line part in a repeated pattern.

14. The display device according to claim 10, wherein the (1_2)-th data connection line is electrically connected to the first data line of the third line part at a first contact position, the (2_2)-th data connection line is electrically connected to the second data line of the third line part at a second contact position, the (3_2)-th data connection line is electrically connected to the third data line of the third line part at a third contact position, and a direction in which the first contact position, the second contact position, and the third contact position are arranged is different from the first direction and the second direction.

15. The display device according to claim 1, wherein the first connection line includes:

a (1_1)-th connection line electrically connected to the at least one first pad part; and a (1_2)-th connection line electrically connected to the at least one second pad part, the second connection line includes:

a (2_1)-th connection line electrically connected to the (1_1)-th connection line; and a (2_2)-th connection line electrically connected to the (1_2)-th connection line, the (1_2)-th connection line includes the first extension data connection line, and the (2_2)-th connection line includes the second extension data connection line.

16. The display device according to claim 15, further comprising:

a fan-out area in which a distance between the (2_1)-th connection lines adjacent to each other in the second direction is changed, wherein the fan-out area is disposed in the first display area without being disposed in the second display area.

17. The display device according to claim 16, wherein the (1_1)-th connection line and the (2_1)-th connection line are electrically connected to each other in a first contact part disposed in the first display area, the (1_2)-th connection line and the (2_2)-th connection line are electrically connected to each other in a second contact part disposed in the second display area, and an outer line of the fan-out area corresponds to a line on which the first contact part is arranged.

18. The display device according to claim 17, wherein the fan-out area overlaps the at least one first pad part in the first direction and does not overlap the at least one second pad part in the first direction.

19. The display device according to claim 1, wherein the pixel includes a first pixel disposed in the first display area and a second pixel disposed in the second display area, the first connection line includes a first scan line, the second connection line includes a second scan line, the first pixel and the second pixel receive a scan signal through any one of the first scan line and the second scan line connected to any one of the at least one first pad part;

the first pixel receives a data signal provided through another one of the at least one first pad part, and the second pixel receives a data signal provided through one of the at least one second pad part.

20. The display device according to claim 1, wherein the second display area includes a (2_1)-th display area and a (2_2)-th display area each adjacent to the first display area in the first direction, and the (2_1)-th display area is disposed on a side of the first display area, and the (2_2)-th display area is disposed on another side of the first display area.

21. A display device including:

a display area;

a pad area;

a pixel disposed in the display area;

a scan driver providing a scan signal for the pixel;

a data driver providing a data signal for the pixel;

a line bundle extending in a first direction and having line patterns repeatedly disposed; and a pad part disposed in the pad area and including:

a scan pad part electrically connected to the scan driver; and a data pad part electrically connected to the data driver, wherein the line bundle includes a first line bundle, a second line bundle, and a third line bundle each including a data line, the first line bundle includes a first scan line extending in the first direction, the second line bundle includes an extension data connection line corresponding to the first scan line of the first line bundle in a repeated pattern, the second line bundle and the third line bundle do not include the first scan line, the third line bundle does not overlap the data pad part in the first direction, and the data line of the third line bundle is electrically connected to the data pad part through the extension data connection line of the second line bundle.

* * * * *